(12) United States Patent
Vompolu et al.

(10) Patent No.: US 10,275,227 B1
(45) Date of Patent: Apr. 30, 2019

(54) DETERMINING FUNCTIONAL EQUIVALENCE OF CONFIGURATIONS OF A MODEL

(71) Applicant: The MathWorks, Inc., Natick, MA (US)

(72) Inventors: Ravi Vompolu, Ashland, MA (US); Ivan Garcia, Framingham, MA (US); Gareth Thomas, Eindhoven (NL); Paul Cox, Sevres (FR); Ebrahim Mestchian, Newton, MA (US); Pieter J. Mosterman, Framingham, MA (US)

(73) Assignee: The MathWorks, Inc., Natick, MA (US)

( * ) Notice: Subject to any disclaimer, the term of this patent is extended or adjusted under 35 U.S.C. 154(b) by 102 days.

(21) Appl. No.: 14/627,540

(22) Filed: Feb. 20, 2015

(51) Int. Cl.
- *G06F 9/44* (2018.01)
- *G06F 8/35* (2018.01)
- *G06F 11/34* (2006.01)
- *G06F 11/36* (2006.01)
- *G06F 8/75* (2018.01)
- *G06F 8/71* (2018.01)

(52) U.S. Cl.
CPC .............. *G06F 8/35* (2013.01); *G06F 8/71* (2013.01); *G06F 8/75* (2013.01); *G06F 11/3409* (2013.01); *G06F 11/3684* (2013.01); *G06F 11/3688* (2013.01)

(58) Field of Classification Search
None
See application file for complete search history.

(56) References Cited

U.S. PATENT DOCUMENTS

| 6,681,383 B1 * | 1/2004 | Pastor ....................... G06F 8/30 717/126 |
| 7,043,693 B2 * | 5/2006 | Wenzel ..................... G06F 8/34 715/715 |
| 7,340,684 B2 * | 3/2008 | Ramamoorthy ... G05B 19/0426 715/763 |
| 7,584,465 B1 * | 9/2009 | Koh .......................... G06F 8/34 717/109 |

(Continued)

OTHER PUBLICATIONS

National Instruments, "How Can I Optimize/Reduce FPGA Resource Usage and/or Increase Speed?" http://digital.ni.com/public.nsf/allkb/311C18E2D635FA338625714700664816, Jan. 28, 2014, 2 pages.

*Primary Examiner* — Matthew J Brophy
(74) *Attorney, Agent, or Firm* — Harrity & Harrity, LLP

(57) ABSTRACT

A method may comprise determining, by executing a first model having first configuration parameters, a first result associated with the first model. The method may comprise determining, by executing a second model having second configuration parameters, a second result associated with the second model. The method may comprise determining, based on the first result, the second result, and equivalency criteria, that the second model is not functionally equivalent to the first model. The equivalency criteria may indicate that the second model is functionally equivalent to the first model when a difference between the second result and the first result satisfies a threshold. The method may comprise modifying a configuration parameter, of the second configuration parameters, to cause the second model to improve toward functional equivalence with the first model.

24 Claims, 14 Drawing Sheets

(56) References Cited

U.S. PATENT DOCUMENTS

| | | | | | |
|---|---|---|---|---|---|
| 7,987,445 | B2* | 7/2011 | Fuller, III | | G06F 8/34 345/630 |
| 8,146,007 | B2* | 3/2012 | Ramamoorthy | | G05B 19/0426 715/762 |
| 8,315,960 | B2* | 11/2012 | Chen | | G06N 7/005 370/400 |
| 8,336,030 | B1* | 12/2012 | Boissy | | G06F 8/71 717/122 |
| 8,464,204 | B1* | 6/2013 | Thornton | | G06F 11/3608 717/100 |
| 8,522,196 | B1* | 8/2013 | Kim | | G06F 11/3664 717/100 |
| 8,566,804 | B1* | 10/2013 | Carrick | | G06F 8/35 703/22 |
| 8,667,381 | B1* | 3/2014 | Feng | | G06F 8/71 715/211 |
| 8,694,947 | B1* | 4/2014 | Venkataramani | | G06F 17/5045 716/113 |
| 8,983,823 | B1* | 3/2015 | Koh | | G06F 8/34 703/22 |
| 8,990,739 | B2* | 3/2015 | Gu | | G06F 17/5081 703/16 |
| 9,047,165 | B1* | 6/2015 | Mosterman | | G06F 8/35 |
| 9,317,628 | B1* | 4/2016 | Koh | | G06F 17/5009 |
| 9,355,000 | B1* | 5/2016 | Biswas | | G06F 11/3062 |
| 9,436,441 | B1* | 9/2016 | Venkataramani | | G06F 8/443 |
| 9,626,161 | B2* | 4/2017 | Elliman | | G06F 8/20 |
| 2002/0188701 | A1* | 12/2002 | Brown | | G06F 9/44505 709/220 |
| 2004/0167764 | A1* | 8/2004 | Wohl | | G01R 31/31813 703/14 |
| 2006/0156294 | A1* | 7/2006 | Fuller, III | | G06F 8/34 717/154 |
| 2006/0168183 | A1* | 7/2006 | Fuller, III | | G05B 19/0426 709/223 |
| 2006/0190105 | A1* | 8/2006 | Hsu | | G06F 8/34 700/86 |
| 2006/0282252 | A1* | 12/2006 | Ciolfi | | G06F 8/10 703/22 |
| 2007/0283322 | A1* | 12/2007 | Hsu | | G06F 8/34 717/113 |
| 2008/0098349 | A1* | 4/2008 | Lin | | G06F 8/10 717/106 |
| 2008/0244525 | A1* | 10/2008 | Khalil | | G06F 11/3688 717/124 |
| 2009/0083699 | A1* | 3/2009 | Santhanam | | G06F 8/436 717/107 |
| 2010/0131440 | A1* | 5/2010 | Chen | | G06F 9/44505 706/15 |
| 2010/0223564 | A1* | 9/2010 | Hsu | | G06F 8/34 715/763 |
| 2010/0293528 | A1* | 11/2010 | Austin | | G06F 8/34 717/113 |
| 2012/0254827 | A1* | 10/2012 | Conrad | | G06F 8/35 717/104 |
| 2014/0157218 | A1* | 6/2014 | Gu | | G06F 17/5081 716/112 |
| 2014/0214373 | A1* | 7/2014 | Jardin | | G06T 11/206 703/2 |
| 2014/0359589 | A1* | 12/2014 | Kodosky | | G06F 8/451 717/149 |
| 2014/0359590 | A1* | 12/2014 | Kodosky | | G06F 8/451 717/149 |
| 2015/0178418 | A1* | 6/2015 | Gu | | G06F 17/505 716/107 |
| 2016/0019057 | A1* | 1/2016 | Bach | | G06F 8/10 717/120 |

* cited by examiner

DETERMINING FUNCTIONAL EQUIVALENCE OF CONFIGURATIONS OF A MODEL

DETAILED DESCRIPTION

Figure 1A:
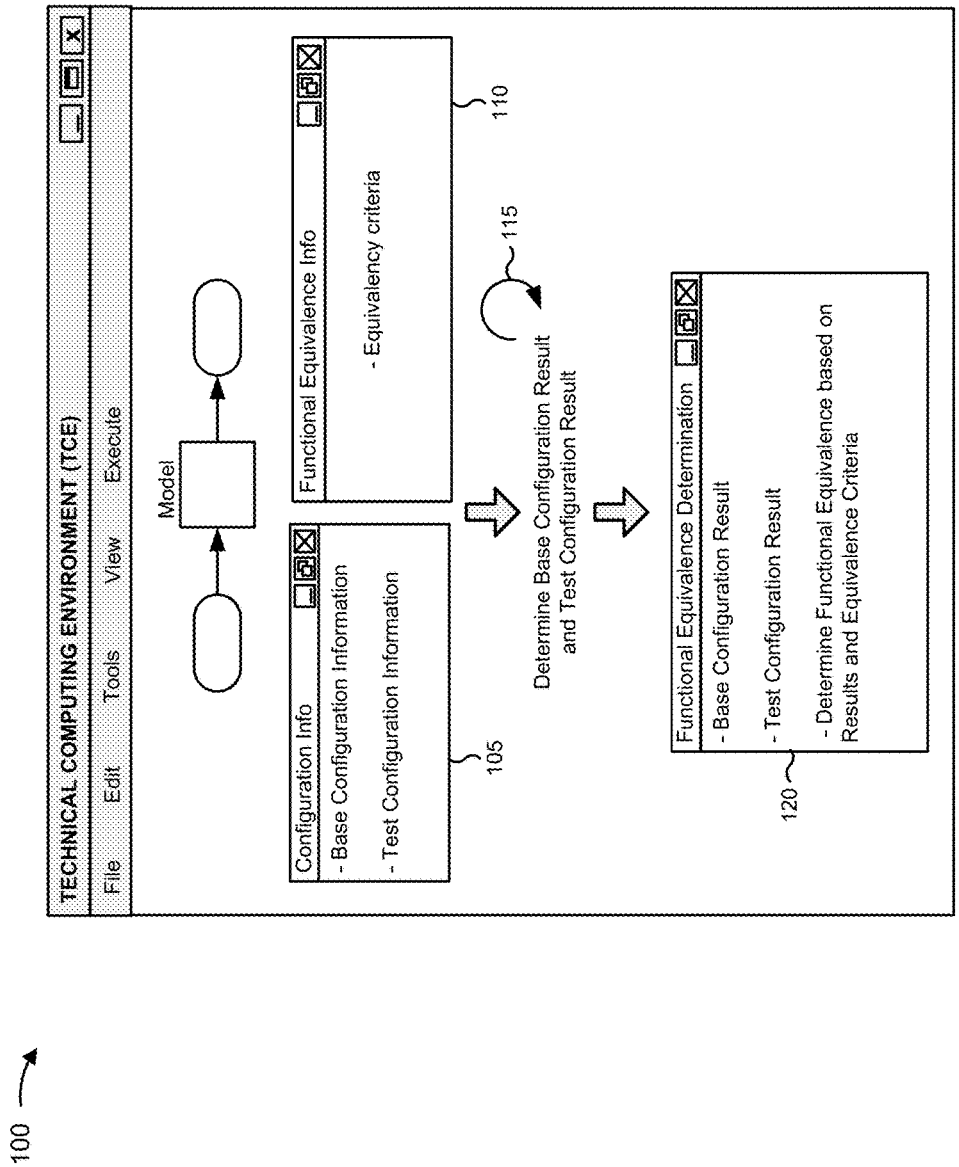
FIGS. 1A and 1B are diagrams of an overview of an example implementation described herein.

The following detailed description of example implementations refers to the accompanying drawings. The same reference numbers in different drawings may identify the same or similar elements.

A user device (e.g., that hosts a technical computing environment (TCE)) may receive a model (e.g., a block diagram model) that is described by a base set of configuration parameters (e.g., model level configuration parameters, block level configuration parameters, etc.). In some cases, the user device may also receive (e.g., based on user input) a test set of configuration parameters (e.g., or multiple test sets of configuration parameters) associated with the model. In such a case, a user may wish to be provided with information indicating whether a result determined based on executing the model using the base set of configuration parameters (e.g., a base result) is functionally equivalent to a result determined based on executing the model using the test set of configuration parameters (e.g., a test result). In some implementations, the test result may be said to be functionally equivalent to the base result when a difference between the test result and the base result satisfies a threshold (e.g., when the test result is a first numerical value, the base result is a second numerical value, and the test result differs from the base result by less than a numerical value threshold; when the test result is a first amount of RAM, the base result is a second amount of RAM, and the test result differs from the base result by less than a RAM threshold, etc.).

Moreover, the user may wish to be provided with information that identifies one or more configuration parameters that differ between the base set of configuration parameters and the test set of configuration parameters and cause the test model to be functionally inequivalent to the base model. Similarly, the user may wish to be provided with information that identifies one or more configuration parameters that, if differing between the base set of configuration parameters and the test set of configuration parameters, would not cause the test model to be functionally inequivalent to the base model. Finally, the user may wish to be provided with performance information, associated with the execution of the base model and the test model, for example, based on processor in the loop (PIL) testing performed by executing each model configuration on one or more types of target processor.

Implementations described herein may allow a user device to determine whether a test configuration of a model is functionally equivalent to a base configuration of the model, and identify one or more configuration parameters of the model that, if altered between the base configuration and the test configuration, may or may not result in functional inequivalence between the base configuration of the model and the test configuration of the model. Implementations described herein may also allow the user device to determine performance information, associated with executing the base configuration of the model and the test configuration of the model, for example, by causing each configuration of the model to be executed on a corresponding type of target processor.

Figure 1B:
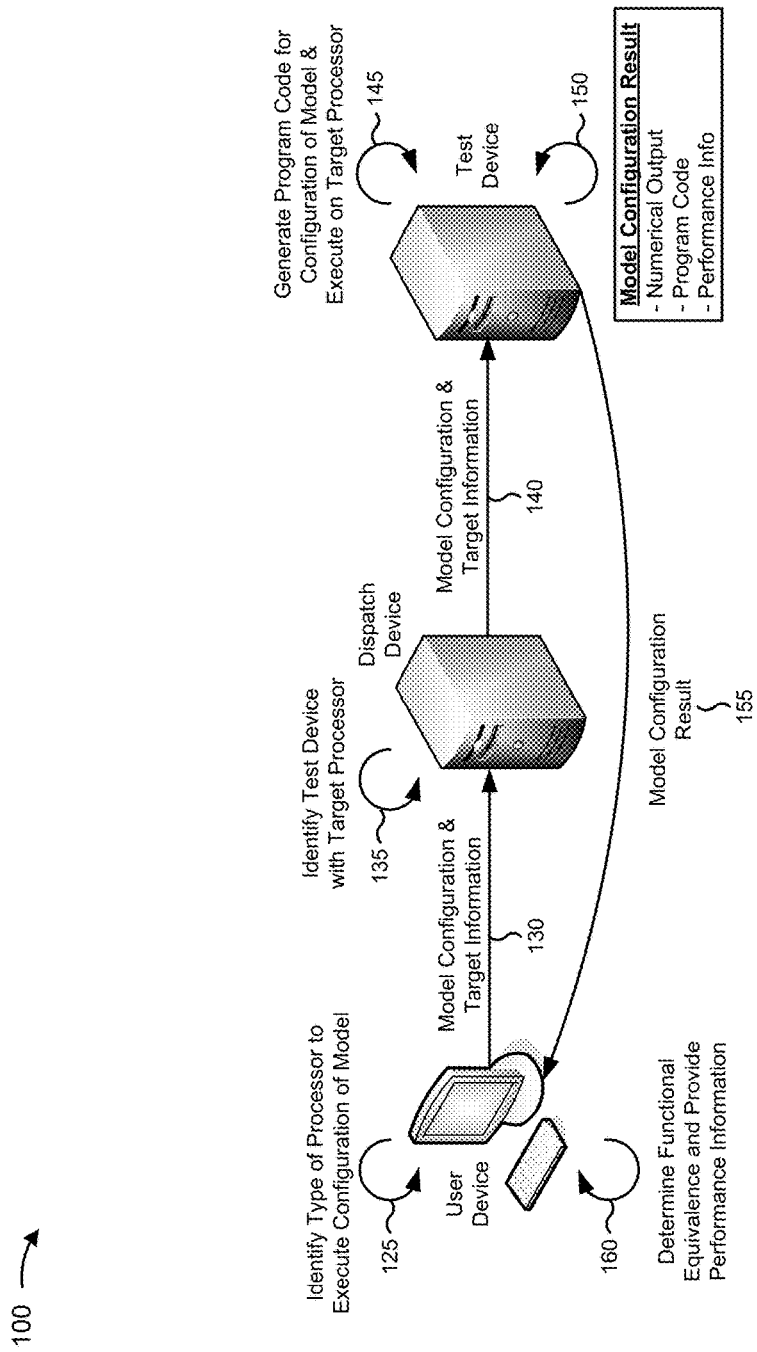

FIGS. 1A and 1B are diagrams of an overview of an example implementation 100 described herein. For the purposes of example implementation 100, assume that an operator of a user device has created a model, including a group of model blocks, within a technical computing environment (TCE).

As shown in FIG. 1A, and by reference number 105, the user device may identify (e.g., based on user input) a base configuration of the model (e.g., a base model) that is described by a base configuration set, and a test configuration of the model (e.g., a test model) that is described by a test configuration set. As shown by reference number 110, the user device may also determine equivalency criteria associated with determining whether the test model is functionally equivalent to the base model. As shown by reference number 115, the user device may (e.g., upon receiving a command to determine whether functional equivalency is present) determine a base result, associated with the base model (e.g., a numerical value associated with executing the base model, program code generated based on the base model), and a test result associated with the test model (e.g., a numerical value associated with executing the test model, program code generated based on the test model).

As shown by reference number 120, the user device may determine, based on the base result, the test result, and the equivalency criteria, whether the test model is functionally equivalent to the base model, and may provide the test result, the base result, and/or information indicating whether the test model is functionally equivalent to the base model. In some implementations, the user device may also provide other information, such as information that identifies a configuration parameter, included in the test configuration set and that differs from a corresponding configuration parameter included in the base configuration set, that causes the functional inequivalence. As another example, the user device may also provide information that identifies a configuration parameter, included in the test configuration set and that is the same as a corresponding configuration parameter included in the base configuration set, that may be modified in the test configuration set without causing functional inequivalence.

For the purposes of FIG. 1B, assume that, as an alternative to the method described in FIG. 1A, the user device is configured to cause a configuration of the model (e.g., the base model and/or the test model) to be executed by a type of target processor associated with the configuration of the model in order to determine the result associated with the configuration of the model. In this way, the user device may also determine performance information associated with executing each configuration of the model. While FIG. 1B is described in the context of causing the test model to be executed by a type of target processor, the process described with regard to FIG. 1B may equally apply to the base model.

As shown in FIG. 1B, and by reference number 125, the user device may determine (e.g., based on user input, based on a determination by the TCE, etc.) target information that identifies a type of target processor that is to execute the test model. As shown by reference number 130, the user device may provide the test model and the target information to a dispatch device associated with forwarding the test model and the target information. As shown by reference number 135, the dispatch device may identify (e.g., based on the target information and information stored by the dispatch device) a test device that includes the target processor, and, as shown by reference number 140, the dispatch device may forward the test model and the target information to the test device. As shown by reference number 145, the test device may receive the test model, may generate program code for the test model, and may execute the program code on the target processor. As shown by reference number 150, the test device may determine a test result, associated with executing the program code, that includes a numerical output associated with executing the program code, the generated program code, and/or performance information associated with executing the program code. As shown by reference number 155, the test device may provide the test result (e.g., via the dispatch device) to the user device. As shown by reference number 160, the user device may determine, based on the test result, a base result associated with executing the base model (not shown), and the equivalency criteria, whether the test model is functionally equivalent to the base model. As shown, the user device may also provide performance information associated with executing the test configuration of the model (e.g., such that the user may view the performance information associated with executing the test configuration of the model on the target processor).

In this way, a user device may determine whether a test configuration of a model is functionally equivalent to a base configuration of the model, and may identify one or more configuration parameters of the model that, if altered between the base configuration and the test configuration, may or may not result in functional inequivalence between the base configuration of the model and the test configuration of the model. Implementations described herein may also allow the user device to determine performance information, associated with executing the base configuration of the model and the test configuration of the model, for example, based on PIL testing performed by causing each configuration of the model to be executed on one or more corresponding types of target processors.

Figure 2:
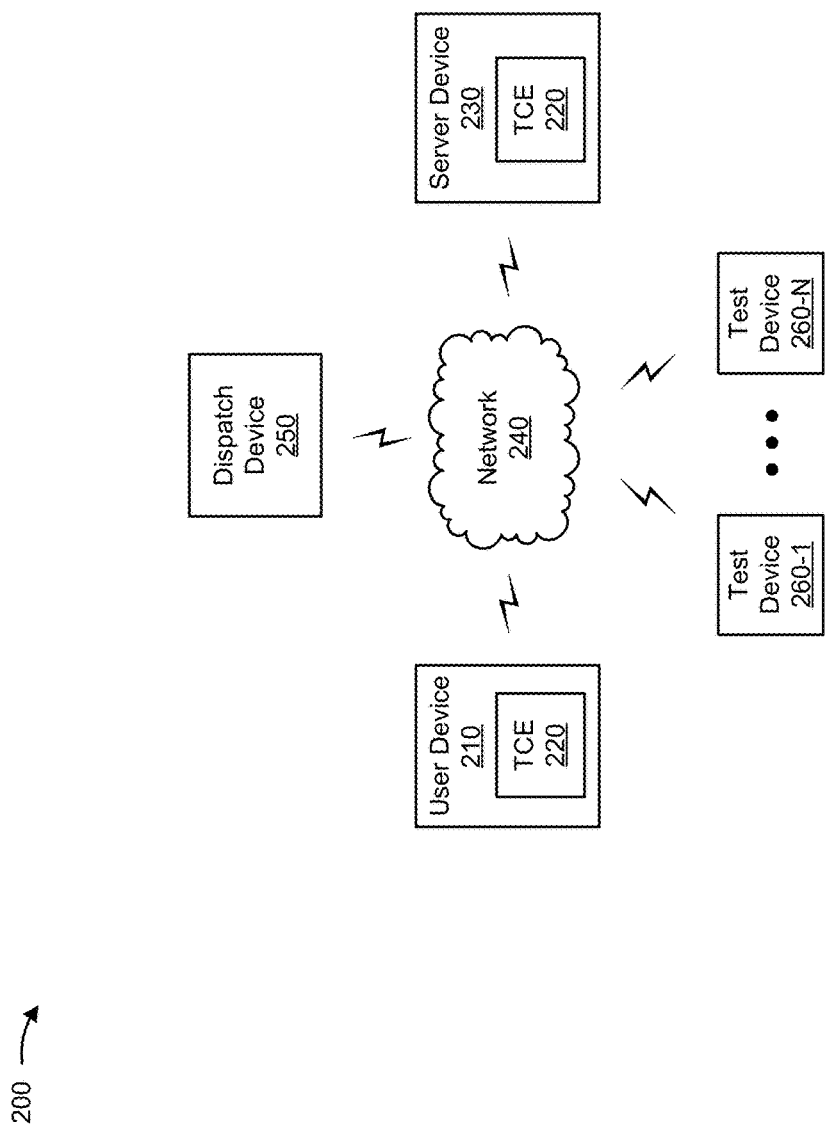
FIG. 2 is a diagram of an example environment in which systems and/or methods, described herein, may be implemented.

FIG. 2 is a diagram of an example environment 200 in which systems and/or methods, described herein, may be implemented. As shown in FIG. 2, environment 200 may include a user device 210, which may include a technical computing environment (TCE) 220. Furthermore, environment 200 may include a server device 230, which may include TCE 220, and a network 240. Additionally, environment 200 may include a dispatch device 250, and a group of test devices 260-1 through 260-N (N≥1) (hereinafter referred to collectively as test devices 260, and individually as test device 260). Devices of environment 200 may interconnect via wired connections, wireless connections, or a combination of wired and wireless connections.

User device 210 may include one or more devices capable of receiving, generating, storing, processing, and/or providing information associated with a model, such as information that describes the model and/or information associated with one or more configurations (e.g., based on one or more configuration parameters) of the model. For example, user device 210 may include a computing device, such as a desktop computer, a laptop computer, a tablet computer, a mobile phone (e.g., a smart phone, a radiotelephone, etc.), or a similar device. In some implementations, user device 210 may receive information from and/or transmit information to server device 230, dispatch device 250, and/or test device 260.

User device 210 may host TCE 220. TCE 220 may include any hardware-based component or a combination of hardware and software-based components that provides a computing environment that allows tasks to be performed (e.g., by users) related to disciplines, such as, but not limited to, mathematics, science, engineering, medicine, and business. TCE 220 may include a text-based environment (e.g., MATLAB® software by The MathWorks, Inc.), a graphically-based environment (e.g., Simulink® software, Stateflow® software, SimEvents® software, etc., by The MathWorks, Inc.; VisSim by Visual Solutions; LabView® by National Instruments; Agilent VEE by Agilent Technologies; Advanced Design System (ADS) by Agilent Technologies; Agilent Ptolemy by Agilent Technologies; etc.), or another type of environment, such as a hybrid environment that may include, for example, a text-based environment and a graphically-based environment. TCE 220 may include, for example, a user interface, a graphical block diagramming tool, a set of block libraries, etc. that may allow a user to build, create, design, import, load, define, etc. a model of system (e.g., a dynamic system, etc.) for purposes of simulating and/or analyzing the system (e.g., a dynamic system). In some implementations, TCE 220 may allow the user to define, based on configuration parameters associated with TCE 220, one or more configurations of the model.

Server device 230 may include one or more devices capable of receiving, generating, storing, processing, and/or providing information associated with a model, such as information that describes the model and/or information associated with one or more configurations (e.g., based on one or more configuration parameters) of the model. For example, server device 230 may include a computing device, such as a server, a desktop computer, a laptop computer, a tablet computer, or a similar device. In some implementations, server device 230 may host TCE 220. In some implementations, user device 210 may be used to access one or more TCEs 220 running on one or more server devices 230. For example, multiple server devices 230 may be used to execute program code (e.g., serially or in parallel), and may provide respective results of executing the program code to user device 210.

In some implementations, user device 210 and server device 230 may be owned by different entities. For example, an end user may own user device 210, and a third party may own server device 230. In some implementations, server device 230 may include a device operating in a cloud computing environment. In this way, front-end applications (e.g., a user interface) may be separated from back-end applications (e.g., program code execution).

Network 240 may include one or more wired and/or wireless networks. For example, network 240 may include a cellular network, a public land mobile network (PLMN), a local area network (LAN), a wide area network (WAN), a metropolitan area network (MAN), a telephone network (e.g., the Public Switched Telephone Network (PSTN)), an ad hoc network, an intranet, the Internet, a fiber optic-based network, a private network, a cloud computing network, and/or a combination of these or other types of networks.

Dispatch device 250 may include one or more devices capable of receiving, generating, storing, processing, and/or providing information associated with a model, such as a configuration of the model and/or target information associated with the model. For example, dispatch device 250 may include a computing device, such as a server or a group of servers. In some implementations, dispatch device 250 may be capable of receiving a configuration of a model, and determining (e.g., based on target information associated with the model and based on information stored by dispatch device 250) a particular test device 260 to which the configuration of the model is to be sent for execution on a target processor (e.g., for PIL testing). Additionally, or alternatively, dispatch device 250 may be capable of receiving, processing, and/or providing a result (e.g., an output value, program code, performance information, etc.) associated with executing the configuration of the model (e.g., such that the result may be viewed by a user) on a target processor.

Test device 260 may include one or more devices capable of receiving, processing, and/or providing information associated with a configuration of a model. For example, test device 260 may include a computing device, such as a server or a group of servers. In some implementations, test device 260 may include one or more target processors that may be capable of receiving a configuration of a model, generating program code associated with the configuration of the model, executing the program code, and/or providing a result associated with executing the program code. In some implementations, test device 260 may include multiple target processors. In some implementations, test devices 260 may be included in a cloud computing environment.

The number and arrangement of devices and networks shown in FIG. 2 is provided as an example. In practice, there may be additional devices and/or networks, fewer devices and/or networks, different devices and/or networks, or differently arranged devices and/or networks than those shown in FIG. 2. Furthermore, two or more devices shown in FIG. 2 may be implemented within a single device, or a single device shown in FIG. 2 may be implemented as multiple, distributed devices. Additionally, or alternatively, a set of devices (e.g., one or more devices) of environment 200 may perform one or more functions described as being performed by another set of devices of environment 200.

Figure 3:
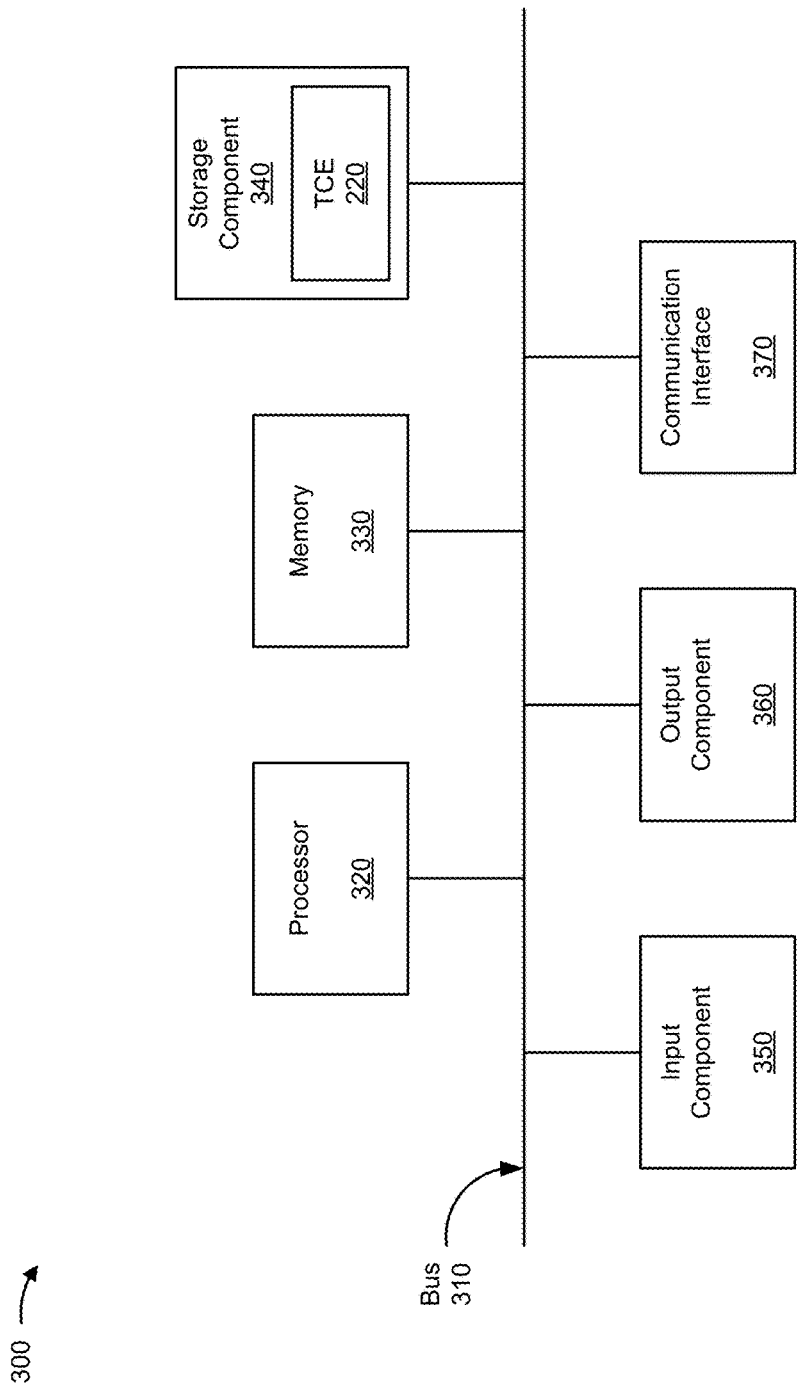
FIG. 3 is a diagram of example components of one or more devices of FIG. 2.

FIG. 3 is a diagram of example components of a device 300. Device 300 may correspond to user device 210, server device 230, dispatch device 250, and/or test device 260. In some implementations, user device 210, server device 230, dispatch device 250, and/or test device 260 may include one or more devices 300 and/or one or more components of device 300. As shown in FIG. 3, device 300 may include a bus 310, a processor 320, a memory 330, a storage component 340, an input component 350, an output component 360, and a communication interface 370.

Bus 310 may include a component that permits communication among the components of device 300. Processor 320 may include a processor (e.g., a central processing unit (CPU), a graphics processing unit (GPU), an accelerated processing unit (APU), etc.), a microprocessor, and/or any processing component (e.g., a field-programmable gate array (FPGA), an application-specific integrated circuit (ASIC), etc.) that interprets and/or executes instructions, and/or that is designed to implement one or more computing tasks. In some implementations, processor 320 may include multiple processor cores for parallel computing. Memory 330 may include a random access memory (RAM), a read only memory (ROM), and/or another type of dynamic or static storage device (e.g., a flash memory, a magnetic memory, an optical memory, etc.) that stores information and/or instructions for use by processor 320.

Storage component 340 may store information and/or software related to the operation and use of device 300. For example, storage component 340 may include a hard disk (e.g., a magnetic disk, an optical disk, a magneto-optic disk, a solid state disk, etc.), a compact disc (CD), a digital versatile disc (DVD), a floppy disk, a cartridge, a magnetic tape, and/or another type of computer-readable medium, along with a corresponding drive. In some implementations, storage component 340 may store TCE 220.

Input component 350 may include a component that permits device 300 to receive information, such as via user input (e.g., a touch screen display, a keyboard, a keypad, a mouse, a button, a switch, a microphone, etc.). Additionally, or alternatively, input component 350 may include a sensor for sensing information (e.g., a global positioning system (GPS) component, an accelerometer, a gyroscope, an actuator, etc.). Output component 360 may include a component that provides output information from device 300 (e.g., a display, a speaker, one or more light-emitting diodes (LEDs), etc.).

Communication interface 370 may include a transceiver-like component (e.g., a transceiver, a separate receiver and transmitter, etc.) that enables device 300 to communicate with other devices, such as via a wired connection, a wireless connection, or a combination of wired and wireless connections. Communication interface 370 may permit device 300 to receive information from another device and/or provide information to another device. For example, communication interface 370 may include an Ethernet interface, an optical interface, a coaxial interface, an infrared interface, a radio frequency (RF) interface, a universal serial bus (USB) interface, a Wi-Fi interface, a cellular network interface, or the like.

Device 300 may perform one or more processes described herein. Device 300 may perform these processes in response to processor 320 executing software instructions stored by a computer-readable medium, such as memory 330 and/or storage component 340. A computer-readable medium is defined herein as a non-transitory memory device. A memory device includes memory space within a single physical storage device or memory space spread across multiple physical storage devices.

Software instructions may be read into memory 330 and/or storage component 340 from another computer-readable medium or from another device via communication interface 370. When executed, software instructions stored in memory 330 and/or storage component 340 may cause processor 320 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number and arrangement of components shown in FIG. 3 is provided as an example. In practice, device 300 may include additional components, fewer components, different components, or differently arranged components than those shown in FIG. 3. Additionally, or alternatively, a set of components (e.g., one or more components) of device 300 may perform one or more functions described as being performed by another set of components of device 300.

Figure 4A:
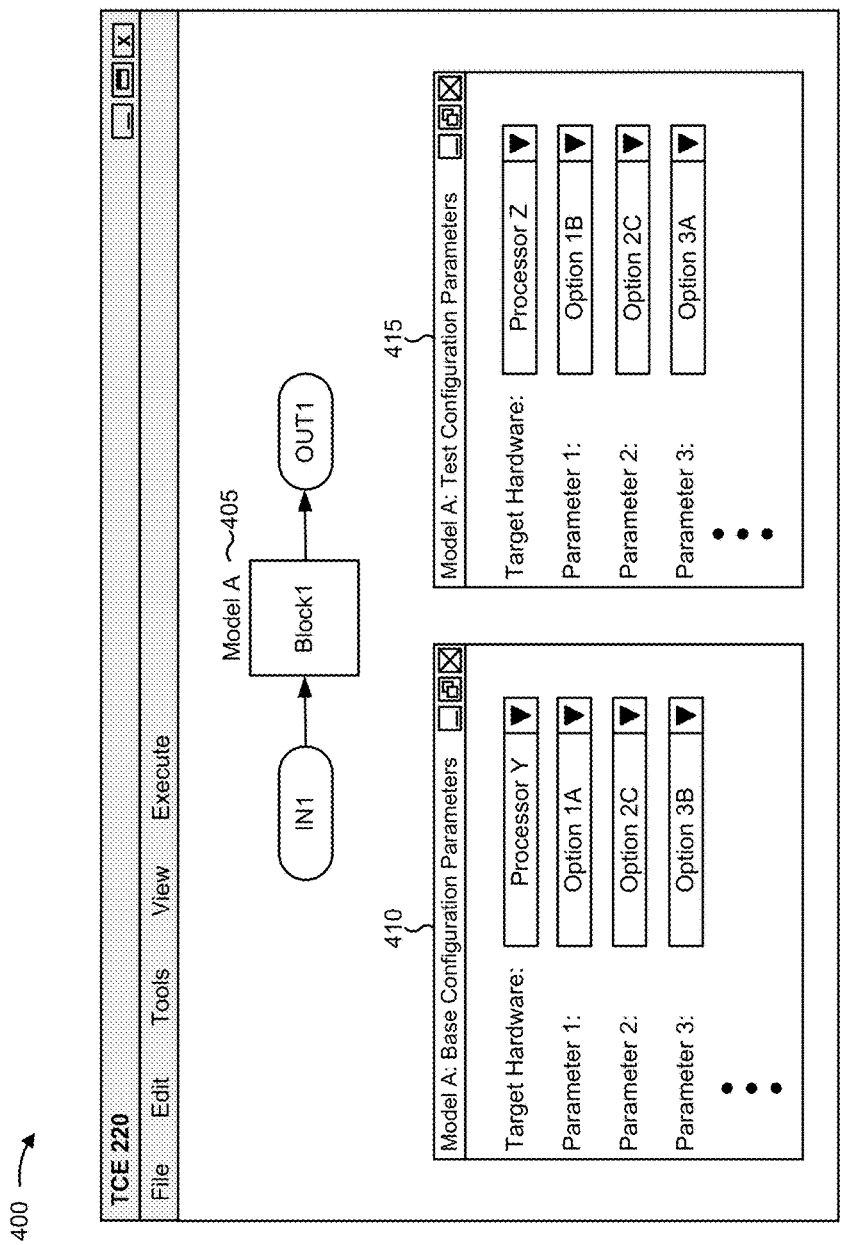
FIGS. 4A-4C are diagrams of an example implementation of determining whether a test configuration of a model is functionally equivalent to a base configuration of the model.
Figure 4B:
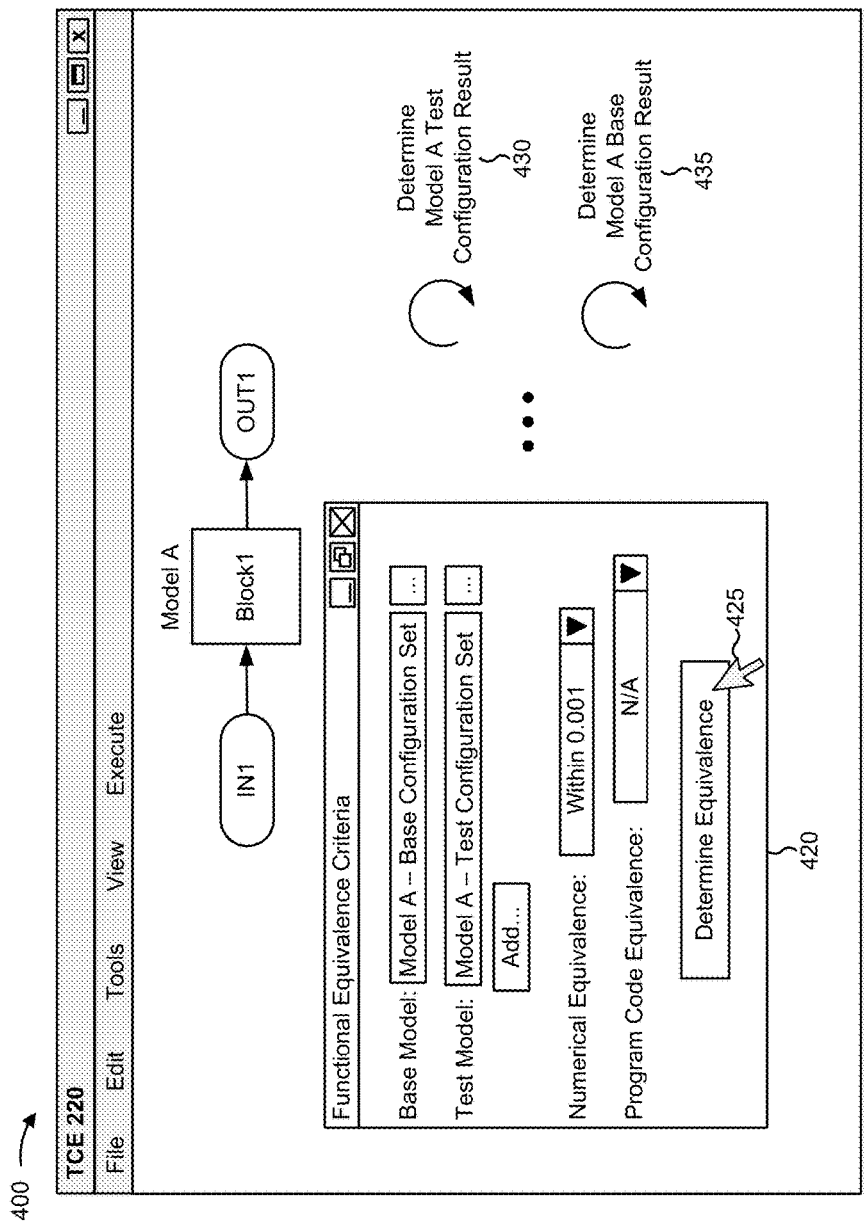
Figure 4C:
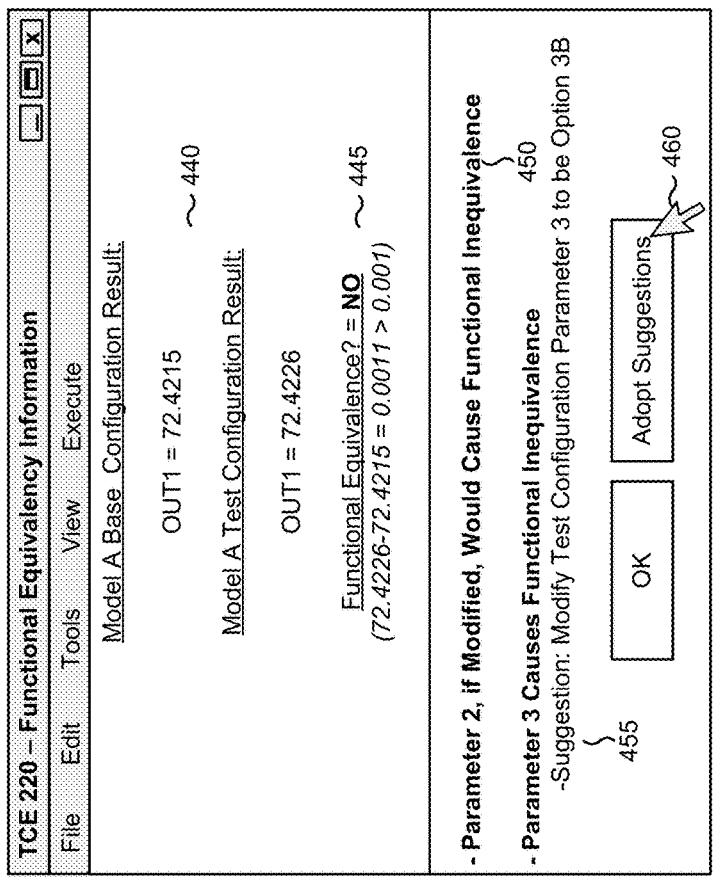

FIGS. 4A-4C are diagrams of an example implementation 400 of determining whether a test configuration of a model is functionally equivalent to a base configuration of the model. For the purposes of example implementation 400, and as shown in FIG. 4A by reference number 405, assume that a user of user device 210 has created, within a model canvas of TCE 220 (e.g., hosted by user device 210), a model, identified as model A, that includes a group of model blocks (e.g., In1, Block1, Out1).

As shown by reference number 410, a base configuration of model A (herein referred to as base model A) may be described by a set of base configuration parameters (herein referred to as a base configuration set) that describe a manner in which model A, and/or program code associated with model A, runs, operates, executes, is generated, etc. A base configuration of a model may include a model that, when executed based on a set of base configuration parameters associated with the model, produces a result with which the user is satisfied. As shown, in some implementations, the user may select, via a user interface of TCE 220, one or more configuration parameters of model A in order to create the base configuration set. For the purposes of example implementation 400, assume that the user is satisfied with a result provided by base model A when model A is executed in accordance with the base configuration set. As shown, the base configuration set may include a group of parameters that identify target hardware associated with executing base model A (e.g., Target Hardware: Processor Y), and multiple other parameters associated with executing base model A (e.g., Parameter 1: Option 1A, Parameter 2: Option 2C, Parameter 3: Option 3B).

As shown, by reference number 415, user device 210 may identify a test configuration of model A (herein referred to as test model A) that is described by a set of test configuration parameters (herein referred to as a test configuration set) that describe another manner in which model A, and/or program code associated with model A, runs, operates, executes, is generated, etc. A test configuration of a model may include a model that is described by a set of test configuration parameters that is different than the set of base configuration parameters. In some implementations, user device 210, and/or another device, may run, execute, operate, etc. the test configuration of the model in order to determine whether the test configuration of the model is functionally equivalent to the base configuration of the model, as described below.

In some implementations, user device 210 may determine one or more configuration parameters included in the test configuration set. For example, user device 210 may determine one or more configuration parameters, included in the test configuration set, based on a prediction (e.g., a prediction based on historical data, based on information associated with the model, based on information stored or accessible by user device 210, etc.). Additionally, or alternatively, the user may select, via a user interface of TCE 220, one or more configuration parameters of model A in order to create the test configuration set. As shown, the test configuration set may include a group of parameters that identify target hardware associated with test model A (e.g., Target Hardware: Processor Z), and multiple other parameters associated with test model A (e.g., Parameter 1: Option 1B, Parameter 2: Option 2C, Parameter 3: Option 3A), some of which are different than the corresponding configuration parameters of base model A. In some implementations, user device 210 may identify multiple test models associated with a single base model (e.g., such that user device 210 may determine whether each of the test models is functionally equivalent to the base model).

As shown in FIG. 4B, user device 210 may determine equivalency criteria for determining whether test model A is functionally equivalent to base model A. A test model may be functionally equivalent to a base model when a test result (e.g., a numerical result, program code generated based on the model, etc.), associated with processing a test model (e.g., executing the model, generating code from the model, compiling the model, etc.), is equal to a base result associated with processing a base model. In some implementations, the test result may be equal to the base result when the results are identical. Additionally, or alternatively, the test result may be equal to the base result when the test result differs from the base result by an amount less than or equal to a threshold setting (e.g., when numerical results differ by less than a threshold numerical value; when generated code differs in less than a threshold number of characters, lines, function call arguments, local variables; when information associated with compiling the model, such as an execution order, a data type assignment, or the like, is compared, etc.).

As shown by reference number 420, the user of user device 210 may input, via a user interface of TCE 220, model A equivalency criteria that indicate that test model A is functionally equivalent to base model A if a numerical result of executing test model A is within 0.001 of a numerical result of executing base model A (e.g., Numerical Equivalence: Within 0.001). As further shown, the user may indicate, via the user interface of TCE 220, that program code equivalence is not to be determined in this case (e.g., Program Code Equivalence: N/A). As shown by reference number 425, user device 210 may receive, for example, based on the user selecting a Determine Equivalence button, a command to determine whether test model A is functionally equivalent to base model A. In some implementations, the command may be based on a user selection associated with a user interface, as described above. Additionally, or alternatively, the command may be programmatically issued (e.g., from a script, from code, etc.) and/or from a command line interface.

As further shown in FIG. 4B, and by reference number 430, user device 210 may determine a result associated with test model A. In some implementations, user device 210 may determine the test result by compiling test model A, executing test model A, and/or generating program code for test model A. Additionally, or alternatively, user device 210 may determine the result based on information provided by another device, such as test device 260. Similarly, as shown by reference number 435, user device 210 may determine a result associated with base model A. In some implementations, user device 210 may determine the base result by compiling base model A, executing base model A, and/or generating program code for base model A. Additionally, or alternatively, user device 210 may determine the base result based on information provided by another device, such as test device 260. Additional details regarding an execution of a test model and/or a base model by test device 260 are described below with regard to FIGS. 6A-6D and FIGS. 7A and 7B.

As shown in FIG. 4C, and by reference number 440, user device 210 may provide, for display, the test model A result (e.g., Model A Test Configuration Result: Out1=72.4226) and the base model A result (e.g., Model A Base Configuration Result: Out1=72.4215). As shown by reference number 445, user device 210 may determine based on the test model A result, the base model A result, and the equivalency criteria, that test model A is not functionally equivalent to base model A, and may provide an indication to the user (e.g., Functional Equivalence=NO (72.4226-72.4215=0.0011>0.001)).

As shown, user device 210 may also provide information associated with the functional equivalence determination. For example, as shown by reference number 450, user device 210 may determine that parameter 2 (e.g., set to Option 2C in both configuration sets), if modified between base model A and test model A, would cause functional inequivalence, and may provide a corresponding indication to the user. As another example, shown by reference number 455, user device 210 may also determine that parameter 3 (e.g., set to Option 3A in the test configuration set and set to Option 3B in the base configuration set), is causing the test model to be functionally inequivalent to the base model, and may provide a corresponding indication the user. As shown, user device 210 may also provide a suggestion, associated with modifying parameter 3 in the test configuration set, that would result in functional equivalence between test model A and base model A. As shown by reference number 460, the user may, by selecting an Adopt Suggestions button, choose to adopt the modification to test model A (e.g., and user device 210 may update test model A accordingly).

As indicated above, FIGS. 4A-4C are provided merely as an example. Other examples are possible and may differ from what was described with regard to FIGS. 4A-4C.

Figure 5:
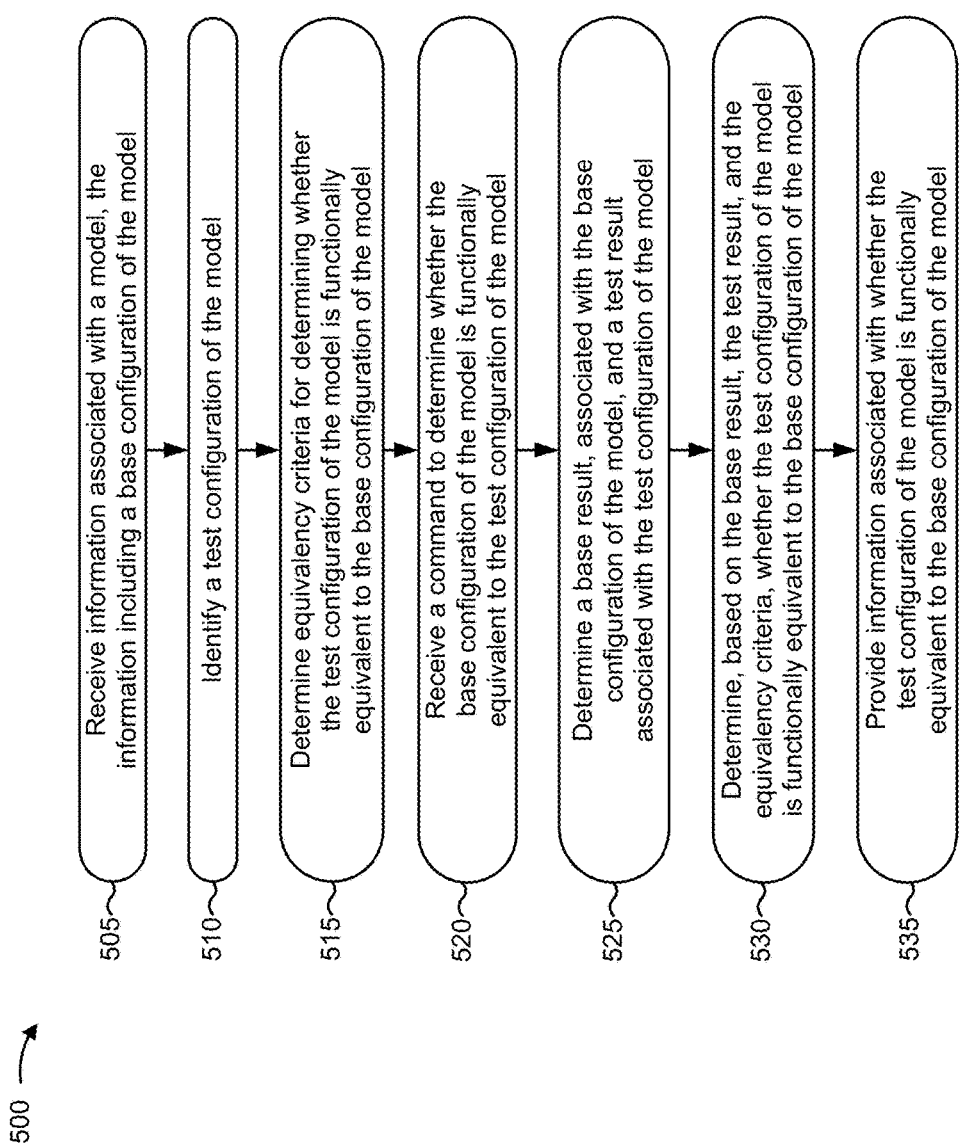
FIG. 5 is a flow chart of an example process for determining whether a test configuration of a model is functionally equivalent to a base configuration of the model.

FIG. 5 is a flow chart of an example process 500 for determining whether a test configuration of a model is functionally equivalent to a base configuration of the model. In some implementations, one or more process blocks of FIG. 5 may be performed by user device 210 (e.g., TCE 220). In some implementations, one or more process blocks of FIG. 5 may be performed by another device or a group of devices separate from or including user device 210, such as server device 230, dispatch device 250, and/or test device 260.

As shown in FIG. 5, process 500 may include receiving information associated with a model, the information including a base configuration of the model (block 505). For example, a user may cause user device 210 to create or open a user interface. The user interface (e.g., a model canvas) may not include any model blocks. The user may then add one or more blocks to the user interface to create the model. For example, in some implementations, user device 210 may receive a command, from the user, that indicates that a model block is to be added to the user interface. User device 210 may receive the command based, for example, on detecting a selection of a particular menu item, entry of a particular textual or audible input from the user, and/or entry of some other predetermined input that indicates a desire to add a model block to the user interface. As another example, user device 210 may receive input (e.g., a drag and drop) that indicates that a model block, included in a block library associated with TCE 220, is to be added to the user interface. Based on the command, user device 210 may add the model block to the user interface. In some implementations, the model may include multiple model blocks.

In some implementations, the model, received by user device 210, may be a base configuration of the model. A base configuration of a model may include a model that, when executed based on a set of base configuration parameters associated with the model, produces a result with which the user is satisfied. For example, user device 210 may receive information associated with a model, and may receive information associated with a set of base configuration parameters for the model, an example of which is described above with regard to reference number 410 in FIG. 4A. In this example, user device 210 may (e.g., based on a receiving a command via user input) execute the model, and may provide a result associated with executing the model, such as an output value associated with the model. Here, if the user is satisfied with the result of the execution of the model, then the model, including the set of base configuration parameters, may be considered to be a base configuration of the model.

A set of configuration parameters, referred to herein as a configuration set, may include a set of parameters, associated with a model, that describe a manner in which the model, and/or program code associated with the model, runs, operates, executes, is generated, etc. For example, the configuration set may include one or more parameters associated with optimizing a performance of the model, an execution of the model, code generated from the model, etc. As another example, the configuration set may include one or more parameters associated with a type of target processors associated with the model (e.g., a type of target processor on which the model may be executed).

In some implementations, one or more of the configuration parameters, included in the set of configuration parameters, may affect a performance quality associated with the model. For example, one or more configuration parameters may affect a quantity of RAM usage during an execution of the model (e.g., setting a parameter associated with optimizing global data access to use global memory to hold temporary results, setting a parameter associated with passing reusable subsystem output variables to pass the reusable subsystem outputs as individual arguments, etc.). As another example, one or more configuration parameters may affect a quantity of ROM usage during an execution of the model (e.g., expression folding, setting a parameter associated with sharing code placement to a shared location configuration, setting a parameter associated with optimizing global data access to minimize access to global memory access, setting a parameter associated with passing reusable subsystem output variables to pass the reusable subsystem outputs as structure references, etc.). As yet another example, one or more configuration parameters may affect an execution speed associated with the model (e.g., enabling a conditional input branch execution parameter, enabling a use floating-point multiplication to handle net slope corrections parameter, etc.). As still other examples, one or more configuration parameters may affect numerical accuracy associated with the model, an operation of a compiler and/or a linker associated with the model, and/or another type of performance quality.

In some implementations, a single configuration parameter may affect multiple types of performance qualities. For example, a single configuration parameter, such as a loop unrolling threshold, a memory function threshold (e.g., associated with copying a memory block), a code replacement library to be used for code generation, etc. may affect RAM usage, ROM usage, execution speed, numerical accuracy, and compiler and linker operation associated with executing the model.

In some implementations, a set of configuration parameters may describe a base configuration of the model, as described above. For example, the user may create the model based on a configuration set, and may be satisfied with a result (e.g., an output value, program code generated from the model, an execution speed achieved by the model, etc.). In this example, the configuration set may be the base configuration set. Similarly, another set of configuration parameters (e.g., a test configuration set) may describe a test configuration of the model. For example, user device 210 may determine (e.g., based on user input, based on information provided by TCE 220, based on equivalency criteria, etc.) a test configuration set that describes a test configuration of the model. In this example, user device 210 may compare a result, associated with executing the test configuration of the model, to a result associated with executing the base configuration of the model (e.g., in order to determine whether the test configuration of the model is functionally equivalent to the base configuration of the model). Additional details regarding determining a test configuration of the model are described below.

As further shown in FIG. 5, process 500 may include identifying a test configuration of the model (block 510). For example, user device 210 may identify a test configuration of the model. In some implementations, user device 210 may identify the test configuration of the model after user device 210 receives the base configuration of the model. Additionally, or alternatively, user device 210 may identify the test configuration of the model when user device 210 receives an indication that user device 210 is to identify the test configuration of the model.

A test configuration of a model may include a model that is described by a set of test configuration parameters that is different than the set of base configuration parameters. In some implementations, user device 210 may run, execute, operate, etc. the test configuration of the model in order to determine whether the test configuration of the model is functionally equivalent to the base configuration of the model, as described below. In some implementations, user device 210 may determine multiple test configurations of the model in order to identify a particular test configuration that satisfies equivalency criteria, as described below.

In some implementations, user device 210 may determine the test configuration of the model based on user input. For example, user device 210 may receive a base configuration of the model, as described above. In this example, the user may provide, via a user interface associated with the model, input that identifies a test configuration set that describes a test configuration of the model, an example of which is described above with regard to reference number 415 in FIG. 4A. In some implementations, user device 210 may identify multiple test configurations of the model. For example, user device 210 may identify a first test configuration of the model that describes a first test model, a second test configuration of the model that describes a second test model, etc.

Additionally, or alternatively, user device 210 may determine the test configuration of the model based on equivalency criteria associated with the base model. For example, user device 210 may determine equivalency criteria associated with the model (e.g., as described below), and user device 210 may (e.g., automatically) generate one or more test configurations of the model based on the equivalency criteria. For example, assume user device 210 determines equivalency criteria indicating that the test configuration of the model should be functionally equivalent to the base configuration of the model with respect to an amount of hardware resources (e.g., RAM, ROM, stack memory, etc.) consumed by the test configuration of the model as compared to an amount of hardware resources consumed by the base configuration of the model. In this example, user device 210 may generate (e.g., based on information stored or accessible by user device 210) one or more test configurations of the model that, when executed, may satisfy the equivalency criteria. User device 210 may then determine (e.g., in the manner described below) whether each of the one or more generated test configurations of the model are functionally equivalent to the base configuration of the model. In this way, user device 210 may determine a test configuration of the model that satisfies the equivalency criteria provided by the user.

Additionally, or alternatively, user device 210 may determine the test configuration of the model based on a prediction, made using historical data, provided by user device 210. In some implementations, user device 210 may store and/or have access to historical functional equivalence information associated configuration sets tested at earlier times (e.g., in the manner described below). In this example, user device 210 may receive the base configuration of the model, and TCE 220 may predict (e.g., based on the historical functional equivalence information and the base configuration of the model) one or more configuration parameters, included in the base configuration set, that, if changed in the test configuration set, may result in functional inequivalence between the test configuration of the model and the base configuration of the model. In this example, user device 210 may automatically determine one or more configuration parameters, included in the test configuration set, based on the prediction (e.g., user device 210 may automatically identify a test configuration of the model that includes configuration parameters that may not affect functional equivalence).

Additionally, or alternatively, user device 210 may provide, based on the prediction, an indication that one or more parameters, if changed, may impact functional equivalence. For example, user device 210 may highlight one or more configuration parameters on a user interface, associated with the test configuration of the model, that if modified, may result in functional inequivalence. Additionally, or alternatively, user device 210 may prevent, based on the prediction, the user from modifying one or more configuration parameters that may cause functional inequivalence. For example, user device 210 may "gray out" the one or more configuration parameters such that the user may not modify the one or more configuration parameters in the test configuration of the model.

In some implementations, the historical functional equivalence information may be associated with the user (e.g., the historical functional equivalence information may be specific to the user), an organization associated with the user (e.g., the historical functional equivalence information may be specific to the user's employer), and/or associated with multiple other users (e.g., the historical functional equivalence information may be associated with worldwide users). In some implementations, the prediction may be based on historical functional equivalence information, as described above. Additionally, or alternatively, the prediction may be based on a rule, determined by TCE 220 based on the historical functional equivalence information (e.g., a rule indicating that allowing for loop unrolling increases execution speed and increases memory usage).

In some implementations, user device 210 may provide an indication, associated with the test configuration of the model, as the user creates, builds, edits, etc. the model. For example, assume that the user is the process of building the model within the model canvas, and that the user adds a particular block to the model. In this example, user device 210 may determine (e.g., based on the particular block being added to the model and based on the historical functional equivalence information) that one or more configuration parameters, if different between the base configuration of the model and a test configuration of the model, may result in functional inequivalence, and may provide an indication (e.g., a flag, a warning, etc.) associated with the one or more configuration parameters affected by the addition of the particular block. In this way, the user may be provided with information associated with possible test configurations of the model as the user creates, builds, edits, etc. the model.

As further shown in FIG. 5, process 500 may include determining equivalency criteria for determining whether the test configuration of the model is functionally equivalent to the base configuration of the model (block 515). For example, user device 210 may determine equivalency criteria for determining whether the test configuration of the model (herein referred to as a test model) is functionally equivalent to the base configuration of the model (herein referred to as a base model). In some implementations, user device 210 may determine the equivalency criteria after user device 210 identifies the test model. Additionally, or alternatively, user device 210 may determine the equivalency criteria when user device 210 receives an indication that user device 210 is to determine the equivalency criteria. Additionally, or alternatively, user device 210 may determine the equivalency criteria at another time, as described below.

Equivalency criteria may include criteria associated with determining whether a test result, associated with a test model, is functionally equivalent to a base result associated with a base model. For example, user device 210 may compare the test result the base result, and may determine, based on a difference between the test result and the base result and the equivalency criteria, whether the test model is functionally equivalent to the base model. Additionally, or alternatively, user device 210 may use the equivalency criteria to generate one or more test configurations of the model (e.g., such that user device 210 may identify a test configuration of the model that satisfies the equivalency criteria).

In some implementations, the equivalency criteria may be associated with numerical results of the test model and the base model. For example, the equivalency criteria may indicate that the test model is functionally equivalent to the base model when an output value, associated with the test model, is equal to an output value associated with the base model. As another example, the equivalency criteria may indicate that the test model is functionally equivalent to the base model when the difference between the output values is less than or equal to a threshold value. For example, the equivalency criteria may indicate that the test model is functionally equivalent to the base model when the output values differ by a value of 0.001 or less.

Additionally, or alternatively, the equivalency criteria may be associated with test code (e.g., program code generated based on the test model) and base code (e.g., program code generated based on the base model, such as C program code, hardware description language (HDL) code, etc.). For example, the equivalency criteria may indicate that the test model is functionally equivalent to the base model when the test code is identical to the base code. As another example, the equivalency criteria may indicate that the test model is functionally equivalent to the base model when the test code is identical within a certain threshold. For example, the equivalency criteria may indicate that the test model is functionally equivalent to the base model when the test code differs from the base code within only four lines of program code or less. As yet another example, the equivalency criteria may indicate that the test model is functionally equivalent to the base model when the test code and the base code include program statements that are identical even though a layout of the test code and a layout of the base code may be different (e.g., in terms of additional spaces, line breaks, code block separators, etc.). As still another example, the equivalency criteria may indicate that the test model is functionally equivalent to the base model when the test code and the base code include code statements that are functionally equivalent (e.g., an if-then-else construct may be considered functionally equivalent to a switch-case statement). As a final example, the equivalency criteria may indicate that the test model is functionally equivalent to the base model when the test code and the base code are semantically equivalent (e.g., when only names, such as variable names, function names, method names, or the like, differ between the test code and the base code).

Additionally, or alternatively, the equivalency criteria may be associated with performance information associated with executing program code for the test model and the base model. For example, as described below with regard to FIGS. 6A-6D and 7A and 7B, user device 210 may determine test performance information (e.g., associated with an execution of the test code on a first type of target processor) and base performance information (e.g., associated with an execution of the base code on a second type of target processor). In some implementations, the second type of target processor may be the same as the first type of target processor. In this example, the performance information may include quantities of RAM usage associated with executing the test code and the base code, quantities of ROM usage associated with executing the test code and the base code, execution speeds associated with executing the test code and the base code, numerical accuracies associated with executing the test code and the base code, compiler and linker operations associated with executing the test code and the base code, or another type of performance metric. Here, the equivalency criteria may indicate that the test model is functionally equivalent to the base model when a difference between the test performance information is within a threshold range of the base performance information. For example, the equivalency criteria may indicate that the test model is functionally equivalent to the base model when an execution speed of the test program code differs from an execution speed of the base program code by 0.10 seconds or less.

Additionally, or alternatively, the equivalency criteria may be associated with hardware resources, such as an amount of memory consumed (e.g., RAM, ROM, stack, etc.), an amount of execution resources consumed (e.g., a quantity of clock cycles), an operating temperature of a hardware resource (e.g., a temperature of a processor executing program code associated with the model), a size of program code, an amount of latency caused by the hardware (e.g., a quantity of interrupts during context switching), or the like.

Additionally, or alternatively, the equivalency criteria may be associated with performance (e.g., of a target processor) during execution, such as an execution time (e.g., for a multi-core processor, a single core processor, etc.), an energy efficiency metric, a bandwidth (e.g., when the model is associated with transmitting data), parallel computing (e.g., a threshold quantity of workers, a threshold workload per worker, etc.), an amount of gate usage (e.g., in the case of an FPGA), a computation threshold (e.g., a threshold quantity of computations needed to reach a desired state, a threshold quantity of computations to be performed, a desired output to be achieved before stopping computations, etc.), or the like.

Additionally, or alternatively, the equivalency criteria may be associated with numerical equivalence, such as a bit true match criteria, a tolerance (e.g., relative or absolute), signal matching (e.g., when the test model is to match a signal produced by the base model), pattern recognition, a desired output, or the like.

Additionally, or alternatively, the equivalency criteria may be associated with ensuring that an assertion included in the base model, is not violated. For example the equivalency criteria may indicate that the test model is functional equivalent to the base model when a signal value, during execution of the base model, is within a certain range with respect to a corresponding signal value of the base model.

As another example, the equivalency criteria may be criteria associated with a performance regression (e.g., identified based on performance information associated with executing the base model and the test model) between the test model and the base model. For example, the equivalency criteria may indicate that the test model is functionally equivalent to the base model when test performance information, associated with the test model, differs from base performance information, associated with the test model, by less than or equal to a threshold value associated with a particular performance criteria, such as a generated source code pattern persistence, a program code metrics threshold, or another type of criteria.

In some implementations, user device 210 may determine the equivalency criteria based on user input. For example, the user may provide, via a user interface of TCE 220, information associated with the equivalency criteria, an example of which is described above with regard to reference number 420 in FIG. 4B. As another example, the user may provide the equivalency criteria via a scripting language, a programming language, an evolving language, a requirements language (e.g., using a spreadsheet), a graphical model, or the like. Additionally, or alternatively, user device 210 may determine the equivalency criteria based on information stored by user device 210 or another device. For example, user device 210 may store information that identifies default, standard, recommended, etc. equivalency criteria (e.g., equivalency criteria to be used when the user does not specify the equivalency criteria).

In some implementations, user device 210 may determine the equivalency criteria before user device 210 determines the test result and the base result. Alternatively, user device 210 may determine the equivalency criteria after user device 210 determines the test result and the base result. For example, user device 210 may determine the test result and the base result (e.g., in the manner described below), may provide, to the user, information associated with the test result and the base result (e.g., a numerical difference, a code generation difference, etc.), and may determine (e.g., based on user input) the equivalency criteria after providing the information to the user, and may or may not determine equivalency criteria based on historical information. In some implementations, user device 210 may provide a base result and/or a test result (e.g., determined in the manner described below) for display to the user. For example, user device 210 may superimpose a numerical result (e.g., a numerical test result and/or a numerical base result) on the model (e.g., immediately adjacent to one or more output ports, with values showing to indicate the test result and/or the base result, with different colors indicating the test result and/or the base result, with different colors to indicate a difference between the test result and the base result, a histogram to indicate differences in values for each test included in a test suite, etc.).

As further shown in FIG. 5, process 500 may include receiving a command to determine whether the test configuration of the model is functionally equivalent to the base configuration of the model (block 520). For example, user device 210 (e.g., TCE 220) may receive a command, from the user, to determine whether the test model is functionally equivalent to the base model. Additionally, or alternatively, user device 210 may receive a command, programmatically, to determine whether the test model is functionally equivalent to the base model. In some implementations, user device 210 may receive the command based on detecting a selection of a particular menu item, entry of a particular textual or audible input from the user, and/or entry of some other predetermined input that identifies the desire to determine whether the test model is functionally equivalent to the base model, an example of which is described above with regard to reference number 425 in FIG. 4B.

As further shown in FIG. 5, process 500 may include determining a base result, associated with the base configuration of the model, and a test result associated with the test configuration of the model (block 525). For example, user device 210 may determine a base result, associated with the base model, and a test result associated with the test model. In some implementations, user device 210 may determine the base result and the test result after user device 210 receives the command to determine whether the test model is functionally equivalent to the base model.

In some implementations, user device 210 may determine the base result and the test result based on causing the base model and the test model to be executed. For example, user device 210 may receive the command to determine whether the test model is functionally equivalent to the base model, may compile the test model (e.g., based on the test configuration set), and may cause the test model to be executed based on compiling the test model, an example of which is described above with regard to reference number 430 in FIG. 4B. Similarly, user device 210 may also compile the base model (e.g., based on the base configuration set), and may cause the base model to be executed based on compiling the base model, an example of which is described above with regard to reference number 435 in FIG. 4B. In this example, user device 210 may determine the test result (e.g., an output of the test model, program code generated based on the test model, etc.) based on compiling the test model and/or causing the test model to be executed, and may determine the base result (e.g., an output of the base model, program code generated based on the base model, etc.) based on compiling the base model and/or causing the base model to be executed, an example of which is described above with regard to reference number 440 in FIG. 4C.

In some implementations, user device 210 may cause the base model and/or the test model to be executed using a test and/or a test suite determined by user device 210. For example, user device 210 may generate a test suite, associated with executing the base model and/or the test model, that includes one or more tests (e.g., including inputs, expected outputs, etc.) and may execute the base model and/or the test model using the one or more tests included in the test suite. In some implementations, user device 210 may (e.g., automatically) generate the test suite (e.g., based on a default configuration of user device 210). Additionally, or alternatively, user device 210 may determine the test suite based on user input (e.g., the user may create one or more tests and/or a test suite via input to user device 210).

In some implementations, user device 210 may generate the test suite such that a coverage threshold is satisfied when executing the base model and/or the test model using the test suite. For example, user device 210 may generate the test suite such that a threshold amount of decision coverage, statement coverage, block coverage, lookup table coverage, model coverage, or the like, is satisfied when executing the model using the test suite. In some implementations, a determination of whether the test model is functionally equivalent to the base model may be guided by the coverage threshold. For example, user device 210 may determine whether the test model is functionally equivalent to the base model (e.g., as described below) only when the coverage threshold is satisfied (e.g., if the coverage threshold is not satisfied, then user device 210 may notify the user and/or may generate another and/or a different test suite). In some implementations, user device 210 may determine the coverage threshold based on user input (e.g., the user may provide a desired amount of coverage that must be achieved by executing the base model and/or the test model using the test suite in order to determine whether the test model is functionally equivalent to the base model).

In some implementations, user device 210 may generate a test harness, associated with the test suite, that allows the base model and/or the test model to inject the one or more tests included in the test suite, in order to make a functional equivalence determination. In some implementations, the test harness may be generated at a model level (e.g., when the base model and/or the test model are executed by user device 210). Additionally, or alternatively, the test harness may be in the form of program code (e.g., when PIL testing of the base model and/or the test model is to be performed) and based on one or more target processors that are to be used to execute the base model and/or the test model. In some implementations, (e.g., when test device 260 does not provide for PIL testing) user device 210 may generate a test harness within an embedded application.

Additionally, or alternatively, user device 210 may determine the base result and the test result based on causing base program code, associated with the base model, and test program code, associated with the test model, to be generated. For example, as described in the above example, user device 210 may cause test program code and base program code to be generated during a compiling step associated with each model, and may determine the base result (e.g., the base program code) and the test result (e.g., the test program code) based on causing the base program code and the test program code to be generated.

In some implementations, user device 210 may determine the base result and the test result based on compiling and/or executing the base model and the test model, as described in the above example. Additionally, or alternatively, user device 210 may determine the base result and the test result based on causing testing, associated with the base model and the test model, to be performed by test devices 260. For example, user device 210 may provide (e.g., via dispatch device 250) the test model to a first test device 260 and may provide the base model to a second test device 260. In this example, the first test device 260 may generate program code for the base model, may execute the program code for the base model using a particular target processor, may determine a base result based on executing the base code, and may provide the base result to user device 210. Similarly, the second test device 260 may generate program code for the test model, may execute the program code for the test model using another particular target processor, may determine a test result based on executing the test code, and may provide the test result to user device 210. In this way, user device 210 may determine the base result and the test result by causing testing (e.g., PIL testing) to be performed by test devices 260. In some implementations, test devices 260 may also provide performance information associated with executing the base code and the test code. Additional details associated with performing testing for the base model and the test model are described below with regard to FIGS. 6A-6D and FIGS. 7A and 7B.

As further shown in FIG. 5, process 500 may include determining, based on the base result, the test result, and the equivalency criteria, whether the test configuration of the model is functionally equivalent to the base configuration of the model (block 530). For example, user device 210 (e.g., TCE 220) may determine, based on the base result, the test result, and the equivalency criteria, whether the test model is functionally equivalent to the base model. In some implementations, user device 210 may determine whether the test model is functionally equivalent to the base model after user device 210 determines the base result and the test result. Additionally, or alternatively, user device 210 may determine whether the test model is functionally equivalent to the base model after user device 210 determines the equivalency criteria.

In some implementations, user device 210 may determine whether the test model is functionally equivalent to the base model by comparing a difference between the test result and the base result to the equivalency criteria, an example of which is described above with regard to reference number 445 in FIG. 4C. For example, if the base result includes a first output value, associated with executing the base model, and the test result includes a second output value, associated with executing the test model, then user device 210 may determine the difference between the first output value and the second output value. In this example, user device 210 may compare the difference to a threshold value, included the equivalency criteria, in order to determine whether the test model is functionally equivalent to the base model (e.g., whether the first output value is equal to the second output value, whether the difference is less than the threshold value, etc.). As another example, user device 210 may determine whether the test model is functionally equivalent to the base model by comparing the test code and the base code (e.g., whether the test code is identical to the base code, whether the test code differs from the base code in less than a threshold number of lines of code, etc.). As another example, user device 210 may determine whether the test model is functionally equivalent to the base model by comparing other results of model processing, such as sorted lists, inferred data types, coverage results, or the like.

As further shown in FIG. 5, process 500 may include providing information associated with whether the test configuration of the model is functionally equivalent to the base configuration of the model (block 535). For example, user device 210 may provide information associated with whether the test model is functionally equivalent to the base model. In some implementations, user device 210 may provide the information after user device 210 determines whether the test model is functionally equivalent to the base model. Additionally, or alternatively, user device 210 may provide the information when user device 210 receives an indication that user device 210 is to provide the information.

In some implementations, the information associated with whether the test model is functionally equivalent to the base model (e.g., herein referred to as equivalency result information) may include information that indicates whether the test model is functionally equivalent to the base model.

In some implementations, if the test model is not functionally equivalent to the base model, then the equivalency result information may include information that identifies a configuration parameter, that differs between the base model and the test model, that causes the functional inequivalence, an example of which is described above with regard to reference number 455 in FIG. 4C. In other words, user device 210 may provide information that identifies one or more configuration parameters that are causing functional inequivalence.

In some implementations, user device 210 may identify the parameter that causes the functional equivalence using a search technique, such as a binary search, a linear search, or the like. For example, user device 210 may (after determining that the test configuration of the model is not functionally equivalent to the base configuration of the model) perform a binary search by setting a subset of configurations parameters included in the test configuration such that the subset matches a corresponding subset of configuration parameters in the base configuration, determining another test result and another base result, and determining whether the other test result is functionally equivalent to the other base result. In such a case, if the functional inequivalence is resolved, then user device 210 may determine that the configuration parameter that causes the functional inequivalence is included in the subset of configuration parameters of the test model. User device 210 may repeat this process for subsets of the subset of configuration parameters in order to identify the configuration parameter that causes the functional inequivalence. In some implementations, user device 210 may divide the set of configuration parameters into two or more subsets for the purpose of performing a binary search.

As another example, user device 210 may (after determining that the test configuration of the model is not functionally equivalent to the base configuration of the model) perform a linear search by setting a first configuration parameter included, in the test configuration, such that the first configuration parameter matches a corresponding configuration parameter in the base configuration, determining another test result and another base result, and determining whether the other test result is functionally equivalent to the other base result. In such a case, if the functionally inequivalence is resolved, then user device 210 may determine that the configuration parameter that causes the functional inequivalence is the first configuration parameter. Otherwise, user device 210 may repeat this process for additional configuration parameters in order to identify the configuration parameter that causes the functional inequivalence.

In some implementations, user device 210 may provide an affordance (e.g., a button, a menu, etc.) that, if selected, causes user device 210 to display a user interface (e.g., a configuration set dialog box) that allows the user to modify the parameter that is causing the functional inequivalence, an example of which is described above with regard to reference number 460 in FIG. 4C. Additionally, or alternatively, user device 210 may automatically (e.g., upon approval by the user) modify the parameter that is causing the functional inequivalence. For example, user device 210 may provide a suggestion, associated with modifying the parameter causing the functional inequivalence, and the user may adopt the suggestion by selecting a corresponding button. Additionally, or alternatively, the user may select a test configuration of the model for adoption (e.g., a test model that satisfies the equivalency criteria, a test model that does not satisfy the equivalency criteria but is acceptable to user, etc.). In some implementations, user device 210 may store the test models (e.g., for future use and/or selection by the user).

Additionally, or alternatively, user device 210 may provide information associated with a functional inequivalence between the base model and the test model. In other words, user device 210 may provide information that identifies how far the difference between the test result and the base result is from the equivalency criteria. For example, if the difference between the base result and the test result is equal to a first value (e.g., 0.52), and the equivalency criteria is equal to a second value (e.g., 0.50), then user device 210 may provide information that identifies how far the difference is from the equivalency criteria (e.g., 0.52-0.50=0.02). In some implementations, user device 210 may also provide information that identifies a configuration parameter that differs between the base model and the test model, that, if changed (e.g., if changed in the test model or the base model), may result in functional equivalence between the base model and the test model.

In some implementations, user device 210 may adopt the test model as a new base model. For example, user device 210 may determine that that test model is functionally equivalent to the base model, and may determine (e.g., automatically, based on user input), that the test model is to be adopted as a new base model. User device 210 may then identify additional test models to determine whether the additional test models are functionally equivalent to the new base model in the manner described above.

Additionally, or alternatively, the equivalency result information may include information that identifies a configuration parameter, that, if modified such that the configuration parameter is different between the base model and the test model, would cause functional inequivalence, an example of which is described above with regard to reference number 450 in FIG. 4C. In other words, user device 210 may provide information that identifies one or more configuration parameters that, if changed between the base model and the test model, would cause functional inequivalence. Additionally, or alternatively, the equivalency result information may include information that indicates a manner in which one or more configuration parameters, included in the test configuration set, may be modified in order to optimize the test model. For example, user device 210 may provide information that identifies one or more configuration parameters, include in the test configuration set, that may be modified in order to improve a performance of the test model (e.g., without causing functional inequivalence).

In some implementations, the equivalency result information may include information associated with multiple test models. For example, assume that user device 210 determines a base model, and identifies multiple test models (e.g., each with a different test configuration set). In this example, user device 210 may determine whether each test model is functionally equivalent to the base model, and may provide equivalency result information associated with each test model, accordingly. In this way, the user may be provided with equivalency result information that allows the user to compare the multiple test models. In some implementations, the user may select a test configuration of the model for adoption (e.g., a test model that satisfies the equivalency criteria, a test model that does not satisfy the equivalency criteria but is acceptable to user, etc.). In some implementations, user device 210 may store the test models (e.g., for future use and/or selection by the user).

In some implementations, user device 210 may also provide performance information associated with the test model and the base model. For example, user device 210 may determine performance information (e.g., an execution time, a quantity of memory usage, a quantity of power usage, a temperature, a variable trace associated with one or more variables that are created, modified, output, etc. during the execution of the program code, etc.), determined based on PIL testing associated with the test model and the base model, and may provide the performance information along with the equivalency result information.

In some implementations, if user device 210 determines that the test model is functionally equivalent to the base model, then user device 210 may cause the test model to be executed by one or more target processors (e.g., in the manner described below). Alternatively, user device 210 may cause the test model to be executed by the one or more target processors even if user device 210 has not determined that the test model is functionally equivalent to the base model. In some implementations, user device 210 may (e.g., automatically) cause the test model to be executed by the one or more target processors identified by user device 210 (e.g., in order to allow the user to view and/or compare performance information associated with the one or more target processors).

In some implementations, user device 210 may cause (e.g., automatically, based on user input, etc.) the test model to be executed by a target processor that may not result in functional equivalence, but may result in desirable performance during execution, and user device 210 may identify a manner in which functional equivalence may be achieved for execution by the target processor. Additionally, or alternatively, the user may provide input that identifies one or more configuration parameters, included in the test configuration set, that user device 210 may modify in order to achieve functional equivalence, and user device 210 may cause the multiple configurations of the model to be executed, accordingly. Additionally, or alternatively, user device 210 may cause the test model to be executed on one or more target processors of which the user may not be aware (e.g., but may be available to execute the test model). Additional details associated with performing testing for the base model and the test model are described below with regard to FIGS. 6A-6D and FIGS. 7A and 7B.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

FIGS. 6A-6D are diagrams of an example implementation 600 of performing testing (e.g., PIL testing), associated with a configuration of a model, by executing program code, associated with the configuration of the model, on a target processor, and providing a result associated with the execution of the program code for purposes of determining functional equivalency associated with the configuration of the model.

Figure 6A:
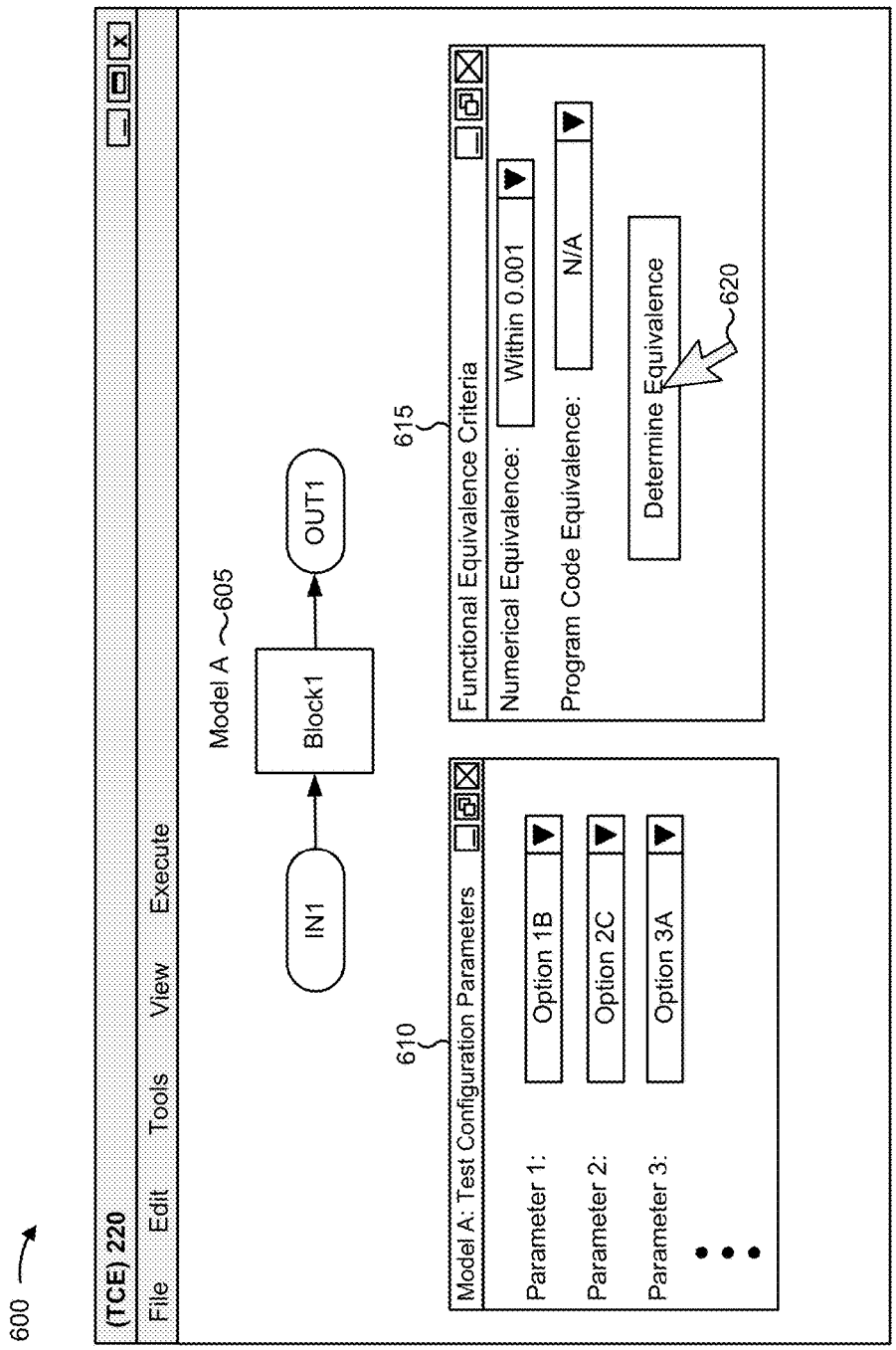
FIGS. 6A-6D are diagrams of an example implementation for performing processor in the loop testing, associated with a configuration of a model, by executing program code, associated with the configuration of the model, on a target processor, and providing a result associated with the execution of the program code for purposes of determining functional equivalency associated with the configuration of the model.

For the purposes of example implementation 600, and as shown in FIG. 6A by reference number 605, assume that a user of user device 210 has created, within a model canvas of TCE 220 (e.g., hosted by user device 210), a model, identified as model A, that includes a group of model blocks (e.g., In1, Block1, Out1). Further, assume that user device 210 has identified a base configuration of model A (e.g., base model A) that is described by a base configuration set. While example implementation 600 describes performing PIL testing associated with the test model, the processes and/or methods of example implementation 600 may equally apply to performing PIL testing for the base model and/or one or more other test models.

As shown by reference number 610, user device 210 may identify a test configuration of model A (herein referred to as test model A) that is described by a set of test configuration parameters. As shown, the test configuration set may include a group of parameters that identify multiple parameters associated with test model A (e.g., Parameter 1: Option 1B, Parameter 2: Option 2C, Parameter 3: Option 3A), some of which are different than the corresponding configuration parameters of base model A (not shown).

As shown by reference number 615, user device 210 may also determine equivalency criteria for determining whether test model A is functionally equivalent to base model A. As shown, the user of user device 210 may input, via a user interface of TCE 220, model A equivalency criteria that indicates that test model A is functionally equivalent to base model A if a numerical result of executing test model A is within 0.001 of a numerical result of executing base model A (e.g., Numerical Equivalence: Within 0.001). As further shown, the user may indicate, via the user interface of TCE 220, that program code equivalence is not to be determined in this case (e.g., Program Code Equivalence: N/A). As shown by reference number 620, user device 210 may receive, based on the user selecting a Determine Equivalence button, a command to determine whether test model A is functionally equivalent to base model A. For the purposes of example implementation 600, assume that user device 210 is configured to determine functional equivalence based on causing each model configuration to be executed on a target processor (e.g., by causing PIL testing to be performed). In this way, user device 210 may determine a result associated with test model A, a result associated with base model A, and may also determine performance information associated with executing each configuration of the model, as described below.

Figure 6B:
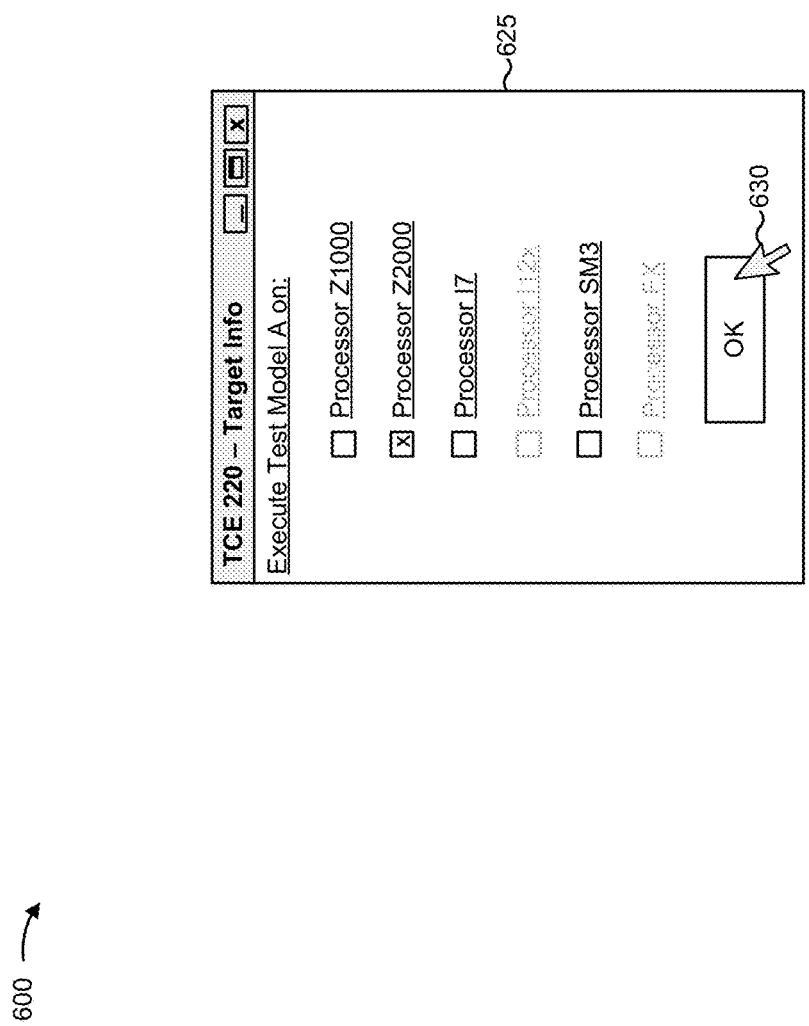

As shown in FIG. 6B, and by reference number 625, user device 210 may determine target information associated with executing test model A on one or more types of target processors. Target information, associated with a configuration of the model, may include information that identifies a type of target processor that is to be used to execute the configuration of the model (e.g., in order to perform PIL testing associated with the configuration of the model). In some implementations, user device 210 may determine the target information based on user input. For example, as shown, user device 210 may provide (e.g., based on information stored by user device 210) a list that includes information that identifies types of target processors that may be used to execute test model A, and the user may select one or more of the types of target processors. As shown, in some implementations, user device 210 may prevent (e.g., by graying out a selection affordance within the user interface) the user from selecting one or more types of target processors that may not execute the configuration of the model. As shown, the user may select one or more types of target processor (e.g., processor Z2000) on which to execute test model A. As shown by reference number 630, the user may select an "OK" button to indicate that PIL testing of test model A on processor Z2000 is to proceed.

Figure 6C:
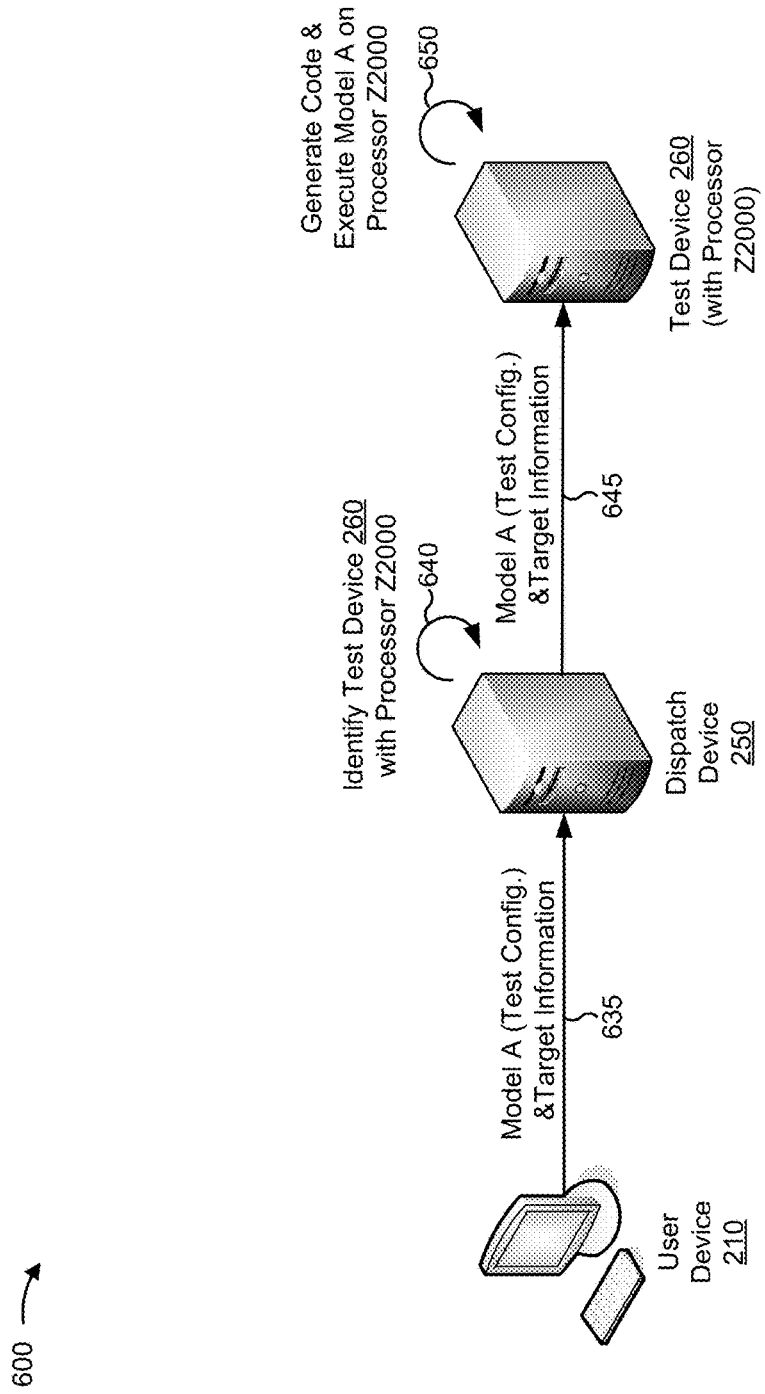

As shown in FIG. 6C, and by reference number 635, user device 210 may provide test model A and the target information to dispatch device 250. As shown by reference number 640, dispatch device 250 may receive the test model A and the target information, and may identify, based on the target information and information (e.g., an index of processors accessible by one or more test devices 260) stored by dispatch device 250, test device 260 that includes a processor of the type processor Z2000. In some implementations, dispatch device 250 may communicate with test device 260 to determine whether processor Z2000 is available to execute test model A. In some implementations, test device 260 may include multiple processors Z2000 and/or one or more other types of processors. As shown by reference number 645, dispatch device 250 may provide test model A and the target information to test device 260. As shown by reference number 650, test device 260 may receive test model A and the target information, may generate test model A program code, and may execute the test model A program code on processor Z2000. Additionally, or alternatively, dispatch device 250 may generate the test model A program code.

Figure 6D:
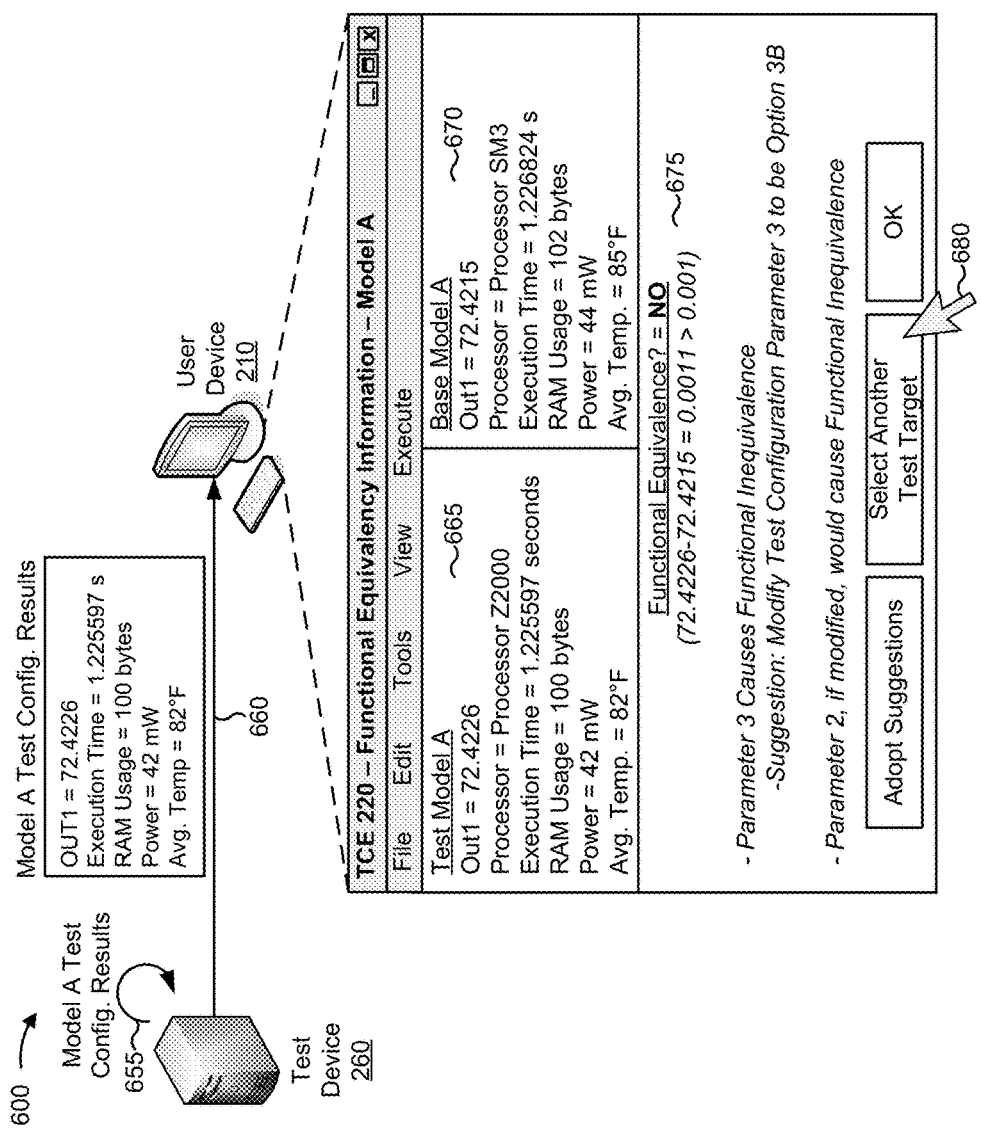

As shown in FIG. 6D, and by reference number 655, test device 260 may determine a result associated with executing the test model A program code, that includes a numerical result (e.g., Out 1=72.4226), and performance information associated with executing the test model A program code (e.g., Execution Time=1.225597 seconds, RAM Usage=100 bytes, Power=42 milliwatts (mW), Average Temperature=82° F.). As shown by reference number 660, test device 260 may provide the result to user device 210 (e.g., via dispatch device 250). In some implementations, test device 260 may provide the result and/or the performance information after test device 260 executes the test model A program code on processor Z2000. Additionally, or alternatively, test device 260 may provide the result and/or the performance information in near real-time while test device 260 executes the test model A program code on processor Z2000. For example, the result and/or the performance information may be relayed in near real-time to user device 210. In this example, the result and/or the performance information may be superimposed on the model and the user may, for example, interactively select another test (e.g., included in a test suite) to be executed next.

As shown, user device 210 may receive the result associated with executing test model A on processor Z2000. For the purposes of example implementation 600, assume that, although not shown, base model A was executed on another type of target processor (e.g., processor SM3), and that user device 210 has also received a result (e.g., including performance information) associated with executing base model A on processor SM3. As shown by reference number 665, user device 210 may provide, for display, the test model A result and the test model A performance information. As shown by reference number 670, user device 210 may also provide, for display, the base model A result (e.g., Out1=72.4215), and the base model A performance information (e.g., Execution Time=1.226824 seconds, RAM Usage=102 bytes, Power=44 mW, and Average Temperature=85° F.). As shown by reference number 675, user device 210 may determine based on the test model A result, the base model A result, and the equivalency criteria, that test model A is not functionally equivalent to base model A, and may provide, for display, an indication to the user (e.g., Functional Equivalence=NO (72.4226-72.4215=0.0011>0.001)). As shown, user device 210 may also provide information associated with the functional equivalence determination (similar to that described above with regard to FIG. 4C). Finally, as shown by reference number 680, the user may indicate, by selecting a Select Another Test Target button, that the user wishes for test model A to be executed on another type of target processor (e.g., when the user is not satisfied with the functional equivalency information and/or the performance information).

In this way, user device 210 may cause a test model and/or a base model to be executed on one or more types of target processors in order to determine whether the test model is functionally equivalent to the base model and/or in order to determine performance information associated with executing each model configuration. In some implementations (e.g., when the user has selected multiple target processors), the user may view results associated with the multiple target processor and/or may view the results (e.g., in order to determine which target processor the user wishes to select).

As indicated above, FIGS. 6A-6D are provided merely as an example. Other examples are possible and may differ from what was described with regard to FIGS. 6A-6D.

Figure 7A:
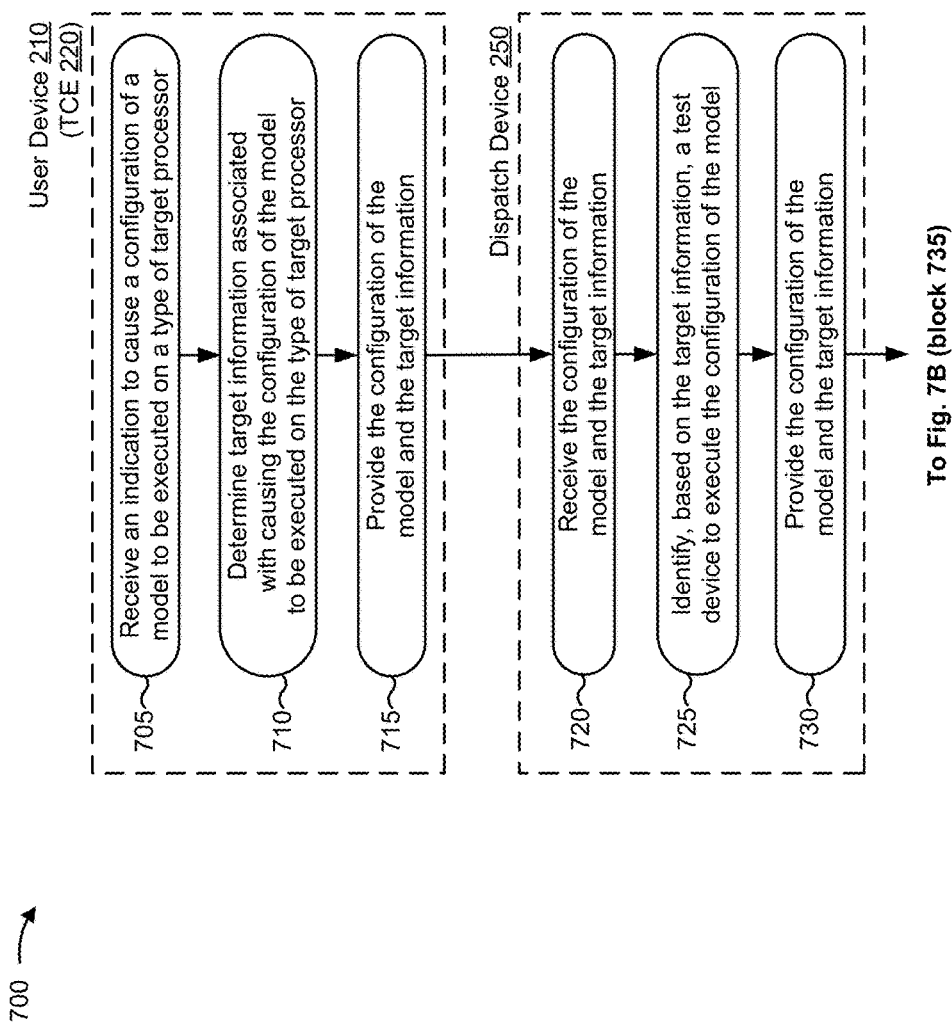
FIGS. 7A and 7B are flow charts of an example process for performing testing, associated with a configuration of a model, by executing program code, associated with the configuration of the model, on a target processor, and providing a result associated with the execution of the program code, for example, for purposes of determining functional equivalency associated with the configuration of the model.
Figure 7B:
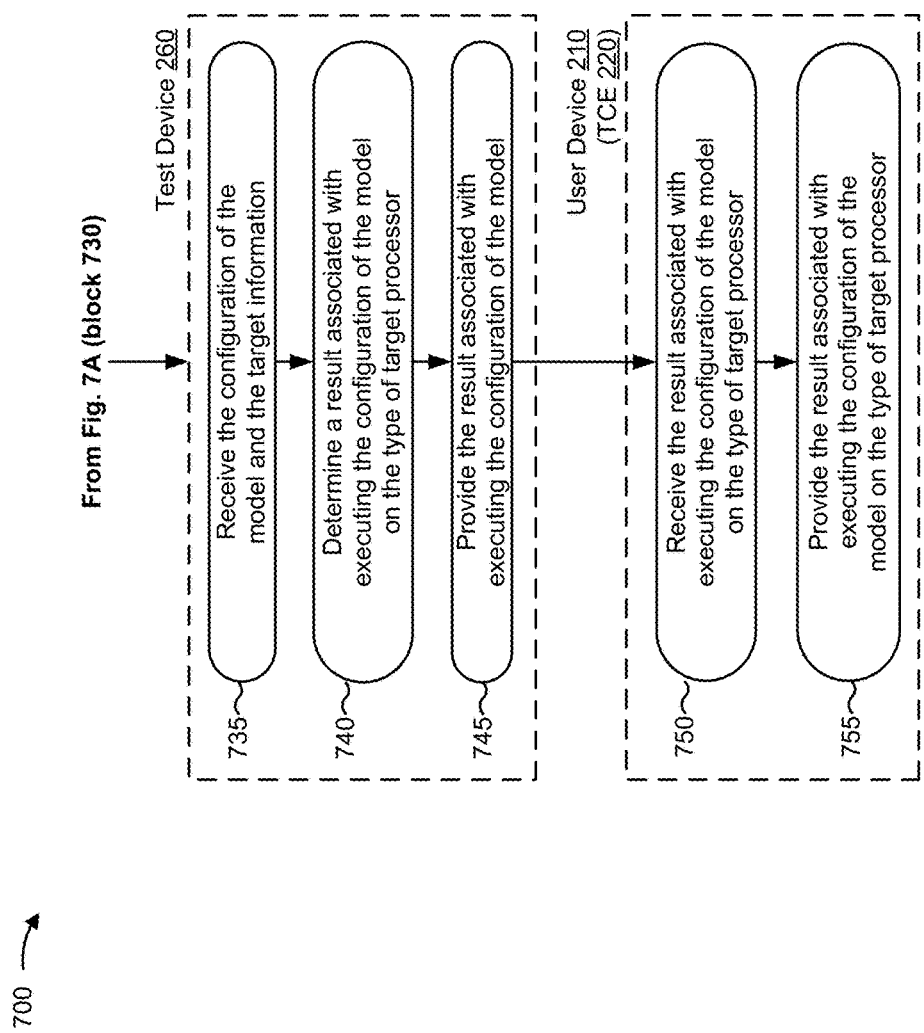

FIGS. 7A and 7B are flow charts of an example process 700 for performing testing (e.g., PIL testing), associated with a configuration of a model, by executing program code, associated with the configuration of the model, on a target processor, and providing a result associated with the execution of the program code, for example, for purposes of determining functional equivalency associated with the configuration of the model. In some implementations, the testing described with regard to example process 700 may be described as web-based testing (e.g., where, in order to perform the testing, user device 210 receives and/or provides information, associated with a model, from and/or to dispatch device 250 and/or one or more test devices 260 via the Internet, a cloud computing network, etc.). Note that while implementations described herein are described in the context of performing PIL testing, implementations using other types of testing may be possible, such as hardware in the loop (HIL), FPGA in the loop (FIL), or the like. In the case of FIL, user device 210 and/or another device of environment 200 may synthesize HDL code (e.g., rather than generating C code) for testing. In some implementations, the type of testing may be a configuration parameter (e.g., a parameter indicating which model parts should execute in hardware or which model parts should execute in software).

In some implementations, one or more process blocks of FIG. 7 may be performed by one or more devices of environment 200. While the process blocks of example process 700 are described as being performed by particular devices of environment 200, in some implementations, one or more of the process blocks of example process 700 may be performed by one or more other devices. Furthermore, the process described by FIGS. 7A and 7B may equally apply to a base configuration of a model (e.g., a base model) or a test configuration of a model (e.g., a test model).

As shown in FIG. 7A, process 700 may include receiving an indication to execute a configuration of a model on a type of target processor (block 705). For example, user device 210 (e.g., TCE 220) may receive an indication to execute a configuration of a model on a type of target processor (e.g., in order to perform PIL testing associated with the configuration of the model). In some implementations, user device 210 may receive the indication when user device 210 receives a command to determine whether a test configuration of the model (e.g., a test model) is functionally equivalent to a base configuration of a model (e.g., a base model), an example of which is described above with regard to reference number 620 in FIG. 6A. In such a case, the command may indicate that user device 210 is to cause both the test model and the base model to be executed on one or more types of target processors (e.g., in order to determine a base result and a test result for purposes of determining functional equivalence). Additionally, or alternatively, user device 210 may receive the indication based on other information, such as user input received by user device 210, that indicates that user device 210 is to cause the configuration of the model (e.g., the base model and/or the test model) to be executed on the type of target processor (e.g., in order to determine performance information associated with the base model and/or the test model).

In some implementations, the indication may be based on user input, as described above. Additionally, or alternatively, the indication may be based on a configuration of user device 210. For example, user device 210 may be configured to execute the configuration of the model on the target processor at particular time intervals (e.g., once a day, once a week, etc.), and user device 210 may receive the indication based on the configuration of user device 210.

As further shown in FIG. 7A, process 700 may include determining target information associated with executing the configuration of the model on the type of target processor (block 710). For example, user device 210 may determine target information associated with executing the configuration of the model on the type of target processor. In some implementations, user device 210 may determine the target information after user device 210 receives the indication to cause the configuration of the model to be executed on the type of target processor. Additionally, or alternatively, user device 210 may determine the target information when user device 210 receives and/or identifies the configuration of the model, as described above (e.g., when the configuration set includes the target information).

Target information, associated with the configuration of the model, may include information that identifies a type of target processor that is to be used to execute the configuration of the model (e.g., in order to perform PIL testing associated with the configuration of the model). For example, the target information may include a brand of the target processor, a name of the target processor, a product series associated with the target processor, and/or another identifier associated with the target processor.

In some implementations, user device 210 may determine the target information based on user input, an example of which is described above with regard to reference number 625 in FIG. 6B. For example, user device 210 may receive the indication to cause the configuration of the model to be executed on the type of target processor, and user device 210 may determine (e.g., based on information stored by user device 210, based on information stored by dispatch device 250 and/or based on information stored by another device) a list of types of target processors that may be available to execute the model. In this example, user device 210 may provide a user interface that allows the user to input (e.g., via check boxes, via a text box, etc.) the target information that identifies the type of target processor. In this way, user device 210 may determine target information that identifies one or more types of target processors such that PIL testing of the configuration of the model may be performed. Additionally, or alternatively, user device 210 may determine the target information based on the configuration set that describes the model (e.g., when the configuration set includes the target information).

In some implementations, user device 210 may prevent the user from selecting one or more types of target processors for PIL testing, an example of which is described above with regard to reference number 625 in FIG. 6B. For example, user device 210 may determine, based on the configuration of the model, that a particular type of target processor may not execute the configuration of the model (e.g., when the model uses floating point numbers and the particular target processor does not have floating point capabilities). In this example, user device 210 may "gray out" information that identifies the particular type of processor within the user interface such that the user may not select the particular type of target processor to execute the model. Additionally, or alternatively, user device 210 may provide an indication (e.g., a flag, a warning, etc.) that the particular type of processor may not be used to execute the configuration of the model. Additionally, or alternatively, user device 210 may provide information indicating a reason that a type of processor may not execute the configuration of the model (e.g., via an affordance that appears when the user identifies the type of processor, such as a tool tip).

In some implementations, the target information may include other information associated with executing the configuration of the model, such as a code replacement library (CRL), a compiler, a software release associated with TCE 220, or the like. In some implementations, user device 210 may provide, via a user interface, affordances that allow the user to select one or more options (e.g., one or more CRLs that may be used, one or more compilers that may be used, one or more compiler options that may be used, one or more software releases that may be used, etc.), and the user may select the one or more target information options accordingly.

Additionally, or alternatively, the target information may include quality of service information associated with executing the configuration of the model. For example, the target information may include information indicating a manner in which user device 210 is to receive a result associated with executing the configuration of the model (e.g., in near-real time, after the execution is complete, etc.), information that identifies a maximum wait time for a target processor, information that identifies a maximum wait time for a result, information that identifies a maximum cost associated with executing the configuration of the model, or the like. In some implementations, dispatch device 250 may identify test device 260 based on the quality of service information, as described below. In some implementations, user device 210 may determine the quality of service information based on a user selection via user device 210.

As further shown in FIG. 7A, process 700 may include providing the configuration of the model and the target information (block 715). For example, user device 210 may provide the configuration of the model and the target information. In some implementations, user device 210 may provide the configuration of the model and the target information after user device 210 determines the target information. Additionally, or alternatively, user device 210 may provide the configuration of the model and the target information when user device 210 receives, from another device, an indication that user device 210 is to provide the configuration of the model and the target information.

In some implementations, user device 210 may provide the configuration of the model and the target information to dispatch device 250 (e.g., via network 240) such that dispatch device 250 may forward the configuration of the model for execution by test device 260, an example of which is described above with regard to reference number 635 in FIG. 6C.

As further shown in FIG. 7A, process 700 may include receiving the configuration of the model and the target information (block 720). For example, dispatch device 250 may receive the configuration of the model and the target information. In some implementations, dispatch device 250 may receive the configuration of the model and the target information after user device 210 provides the configuration of the model and the target information.

In some implementations, dispatch device 250 may validate the configuration of the model based on receiving the configuration of the model and the target information. For example, dispatch device 250 may validate the configuration of the model as functional (e.g., including determining whether dependencies of the model may be resolved, determining whether the configuration of the model is capable of being executed without error, etc.).

As further shown in FIG. 7A, process 700 may include identifying, based on the target information, a test device to execute the configuration of the model (block 725). For example, dispatch device 250 may identify, based on the target information, test device 260 (e.g., that includes a target processor of the type of target processor identified by the target information) to execute the configuration of the model. In some implementations, dispatch device 250 may identify test device 260 after dispatch device 250 receives the configuration of the model and the target information.

In some implementations, dispatch device 250 may identify test device 260 based on information stored by dispatch device 250, an example of which is described above with regard to reference number 640 in FIG. 6C. For example, dispatch device 250 may store information that identifies target processors accessible by test devices 260. In this example, dispatch device 250 may determine, based on the target information, the type of target processor that is to execute the model, and may identify test device 260 (e.g., that includes the type of target processor) based on the stored information and the target information. Additionally, or alternatively, dispatch device 250 may communicate with test device 260 to determine whether test device 260 includes the type of target processor and/or whether the type of target processor, if accessible by test device 260, is available to execute the model, in order to determine other information associated with the target processors, such as a build version, or the like. In some implementations, dispatch device 250 may identify multiple test devices 260. For example, dispatch device 250 may identify multiple test devices 260 when the target information identifies multiple types of target processors that are to execute the configuration of the model or when the type of target processor is available on multiple test devices 260.

In some implementations, dispatch device 250 may identify test device 260 based on information received from test device 260. For example, test device 260 may provide (e.g., automatically upon installation of a target processor, based on user input, etc.), to dispatch device 250, information associated with the target processor accessible by test device 260 (e.g., a type of the target processor, a build version of the target processor, a communications port associated with the target processor, etc.). In this example, dispatch device 250 may store the information associated with the target processor, for example, in a shared file (e.g., in a list, a table, a registry, etc.) associated with multiple test devices 260, such that dispatch device 250 stores information associated with target processors installed on the multiple test devices 260.

Additionally, or alternatively, dispatch device 250 may identify test device 260 based on communicating with test device 260. For example, dispatch device 250 may store or have access to information that identifies one or more test devices 260. In this example, dispatch device 250 may receive the target information (e.g., including information that identifies a type of target processor) and may communicate with the one or more test devices 260 in order to determine information associated with the one or more test devices 260 and/or processors accessible by the one or more test devices 260, such as information indicating whether the one or more test devices 260 include a processor of the type of target processor, information indicating whether the target processor is available to execute the model, version information (e.g., hardware, firmware, etc.) associated with the target processor, quality of service information associated with the target processor (e.g., an amount of time until the target processor will be available, an amount of time until the target processor may provide a result associated with executing the model, a cost associated with executing the model by test device 260 and/or on the target processor, a service provider associated with test device 260, a rating associated with the service provider, etc.). Here, dispatch device 250 may identify test device 260 based on communicating with the one or more test devices 260 (e.g., dispatch device 250 may select test device 260 from the one or more test devices 260).

As further shown in FIG. 7A, process 700 may include providing the configuration of the model and the target information (block 730). For example, dispatch device 250 may provide the configuration of the model and the target information. In some implementations, dispatch device 250 may provide the configuration of the model and the target information after dispatch device 250 identifies test device 260, an example of which is described above with regard to reference number 645 in FIG. 6D. Additionally, or alternatively, dispatch device 250 may provide the configuration of the model and the target information when dispatch device 250 receives, from test device 260, an indication that dispatch device 250 is to provide the configuration of the model and the target information. In some implementations, dispatch device 250 may (e.g., for security purposes) obfuscate and/or encrypt the configuration of the model and/or the target information before providing the configuration of the model and the target information.

In some implementations, dispatch device 250 may provide the configuration of the model and the target information to test device 260. For example, dispatch device 250 may generate a single file (e.g., an archive file, such as a ZIP file), that contains the configuration of the model, the target information, and/or other information (e.g., one or more dependent files associated with the configuration of the model), and may provide the single file to test device 260. As another example, dispatch device 250 may provide the configuration of the model, the target information, and/or the other information in separate files to dispatch device 250.

Additionally, or alternatively, dispatch device 250 may provide the configuration of the model, the target information, and/or other information associated with the model (e.g., a dependent file, a file identified by the user, etc.) by sharing the configuration of the model and the target information via a shared file system. For example, dispatch device 250 may upload the configuration of the model and the target information to a shared file system (e.g., included in a cloud computing network) accessible by dispatch device 250 and test device 260. In this example, dispatch device 250 may then provide a resource locator (e.g., a uniform resource locator (URL), etc.) that identifies a storage location of the configuration of the model and the target information to test device 260. Here, test device 260 may then retrieve the configuration of the model and the target information from the shared file system. In some implementations, the configuration of the model and the target information may be uploaded to the shared file system via TCE 220 (e.g., based on user input associated with a workspace, automatically at particular intervals of time, etc.).

In some implementations, dispatch device 250 may provide multiple configurations of the model. For example, assume that dispatch device 250 receives a configuration of a model, and target information that identifies multiple types of target processors. In this example, dispatch device 250 may identify multiple test devices 260 (e.g., corresponding to the types of target processors), may generate a set of copies of the configuration of the model (e.g., each to be provided to a particular test device 260), and may provide the copies to the multiple test devices 260 accordingly.

As shown in FIG. 7B, process 700 may include receiving the configuration of the model and the target information (block 735). For example, test device 260 may receive the configuration of the model and the target information. In some implementations, test device 260 may receive the configuration of the model and the target information after dispatch device 250 provides the configuration of the model and the target information.

As further shown in FIG. 7B, process 700 may include determining a result associated with executing the configuration of the model on the type of target processor (block 740). For example, test device 260 may determine a result associated with executing the configuration of the model on the type of target processor. In some implementations, test device 260 may determine the result after test device 260 receives the configuration of the model and the target information. Additionally, or alternatively, test device 260 may determine the result when test device 260 (e.g., the target processor) generates and/or executes program code, associated with the configuration of the model, as described below.

In some implementations, test device 260 may determine the result associated with executing the configuration of the model based on executing program code associated with the configuration of the model, an example of which is described above with regard to reference number 650 in FIG. 6C. For example, test device 260 may receive the configuration of the model and the target information, and may identify a target processor, of the type of target processor and accessible by test device 260, that is to execute the configuration of the model. In this example, test device 260 (e.g., the target processor) may generate program code for the configuration of the model, and cause the target processor to execute the program code for the configuration of the model. Test device 260 may determine the result, associated with executing the model on the target processor, based on generating the program code and/or executing the program code on the target processor. In some implementations, the result may include a numerical result associated with executing the program code and/or the program code generated based on the configuration of the model, as described above.

Additionally, or alternatively, the result may include performance information associated with executing the model, an example of which is described above with regard to reference number 655 in FIG. 6D. For example, test device 260 may determine performance information, associated with the target processor and based on executing the program code, such as an execution time associated with executing the program code, a quantity of memory usage associated with executing the program code, a quantity of power usage associated with executing the program code, a temperature of the target processor during the execution of the program code, etc. As another example, the performance information may include a variable trace associated with one or more variables that are created, modified, output, etc. during the execution of the program code.

In some implementations, the result may include profile information associated with the performance information. For example, the result may include profile information, associated with the target processor, determined by test device 260 and based on performance information determined during the execution of the program code (e.g., performance information at each time step during the execution of the model). As an example, test device 260 may determine profile information that identifies first performance information (e.g., a quantity of energy usage, a quantity of memory usage, a quantity of computation time, etc.) at each time step during execution of the model. In this example, test device 260 may also determine, based on the profile information, second performance information associated with the first performance information (e.g., a total quantity of power during the execution, a total quantity of memory usage during the execution, a total quantity of computation time during execution, etc.). In some implementations, test device 260 may generate a graphical interface (e.g., a line graph, a bar graph, a chart, etc.), associated with the profile information, and may provide the graphical interface for display to the user (e.g., via a user interface associated with TCE 220). For example, test device 260 may generate a line graph, depicting a quantity of energy usage with respect to execution time, and may provide the graphical interface to user device 210 for display via TCE 220. In some implementations, test device 260 may generate multiple graphical interfaces associated with the profile information. Additionally, or alternatively, test device 260 may provide the performance information and/or the profile information to TCE 220, and TCE 220 may generate and display the graphical interface.

Additionally, or alternatively, the result may include other information associated with executing the configuration of the model, such as an execution trace, logged data associated with executing the configuration of the model (e.g., logged data of execution time, logged data of power consumption, the program code generated based on the configuration of the model, an execution profile object (e.g., a MAT file, etc.), and/or another type of information. Additionally, or alternatively, the result may include traceability information that includes information indicating a correlation between one or more portions of the result. For example, the result may include information that indicates that a particular portion of the program code (e.g., a line, a function, etc.) and/or a particular portion of the model (e.g., a block, a subsystem, etc.) correlates to a particular portion of the performance information (e.g., an execution time, an amount of memory usage, etc.).

Additionally, or alternatively, the result may include equivalence information associated with the configuration of the model. For example, test device 260 may be configured to determine whether the configuration of the model is functionally equivalent to another configuration of the model (e.g., in the manner described above). In this example, test device 260 may receive (e.g., via user device 210 and/or dispatch device 250) equivalency criteria associated with a test configuration the model and/or a result associated with a base configuration of the model, and may determine, based on the equivalency criteria, whether the test configuration of the model is functionally equivalent to the base configuration of the model. In some implementations, the functional equivalence determination may be performed by a single test device 260. Additionally, or alternatively, the functional equivalence determination may be performed by two or more test devices 260 (e.g., the functional equivalence determination may be partitioned among multiple test devices 260 executing the configuration of the model and each partitioned functional equivalence determination result may be combined to determine an overall functional equivalence determination).

As further shown in FIG. 7B, process 700 may include providing the result associated with executing the configuration of the model on the type of target processor (block 745). For example, test device 260 may provide the result associated with executing the configuration of the model on the type of target processor. In some implementations, test device 260 may provide the result after test device 260 executes the program code associated with the configuration of the model, an example of which is described above with regard to reference number 660 in FIG. 6D. Additionally, or alternatively, test device 260 may provide the result while test device 260 executes the program code associated with the configuration of the model, as described below.

In some implementations, test device 260 may provide the result after test device 260 executes the configuration of the model (e.g., after test device 260 executes the program code associated with the configuration of the model). For example, test device 260 may provide a numerical result after the configuration of the model has been executed on the target processor. Additionally, or alternatively, test device 260 may provide the result during execution of the program code on the target processor. For example, test device 260 may provide performance information, such as a quantity of memory usage, a quantity of power usage, variable trace information, in near-real time during execution of the model on the target processor.

Additionally, or alternatively, test device 260 may provide a result that includes the profile information associated with the execution of the model (e.g., after test device 260 executes the configuration of the model, concurrently with test device 260 executing the configuration of the model, etc.). For example, test device 260 may provide a graphical interface, associated with the profile information, determined based on executing the model, such that the user may view the graphical interface.

In some implementations, test device 260 may provide the result to dispatch device 250, dispatch device 250 may filter, format, modify, etc. the result, and may provide the result to user device 210. For example, test device 260 may provide the result (e.g., program code, profiling information, logged data, equivalence information, etc.) to dispatch device 250. Here, dispatch device 250 may generate a file (e.g., an archive file, such as a ZIP file) that includes the result, and may provide the file to user device 210. Additionally, or alternatively, test device 260 may provide the result to user device 210. Additionally, or alternatively, test device 260 and/or dispatch device 250 may provide the result to another user device 210 (e.g., when the user of user device 210 indicates that the result is to be provided to another user device 210 such that another user may view and/or access the result).

In some implementations, test device 260 and/or dispatch device 250 may provide status information associated with executing the configuration of the model. For example, test device 260 and/or dispatch device 250 may provide, to user device 210, status information that identifies a stage of execution of the model, such as a generating code stage, a compiling stage, a downloading to test device 260 stage, a launching execution stage, a waiting to connect to the target processor stage, a model execution started stage, a model execution in progress stage, a model execution completed stage, a gathering results stage, or the like. In some implementations, test device 260 and/or dispatch device 250 may provide information associated with a test that is being executed (e.g., as part of a test suite), model coverage information associated with the executing the configuration of the model, or the like, etc. In this way, the user may be provided with information that identifies the status of one or more executions of one or more configurations of the model.

As further shown in FIG. 7B, process 700 may include receiving the result associated with executing the configuration of the model on the type of target processor (block 750). For example, user device 210 may receive the result associated with executing the configuration of the model on the type of target processor. In some implementations, user device 210 may receive the result associated with executing the configuration of the model after dispatch device 250 provides the result associated with executing the configuration of the model. Additionally, or alternatively, user device 210 may receive the result associated with executing the configuration of the model after test device 260 provides the result associated with executing the configuration of the model.

In some implementations, upon receiving the result, user device 210 may determine whether a test configuration of the model is functionally equivalent to a base configuration of the model, as described above and with regard to reference number 675 in FIG. 6D. For example, if a first test device 260 (e.g., a first target processor) executes the test configuration of the model, and a second test device 260 (e.g., a second target processor) executes the base configuration of the model, and the first test device 260 and the second test device 260 provide a corresponding test result and a base result to user device 210, then user device 210 may determine whether the test configuration of the model is functionally equivalent to the base configuration of the model in the manner described above.

As further shown in FIG. 7B, process 700 may include providing the result associated with executing the configuration of the model on the type of target processor (block 755). For example, user device 210 may provide the result associated with executing the configuration of the model on the type of target processor. In some implementations, user device 210 may provide the result after user device 210 receives the result. Additionally, or alternatively, user device 210 may provide the result when user device 210 receives an indication to provide the result, such as user input indicating that the result is to be provided for display via user device 210.

In some implementations, user device 210 may provide the result for display to the user. For example, user device 210 may provide, for display in near-real time, information associated with a variable trace during the execution of the configuration of the model. In some implementations, the user may interact with TCE 220 (e.g., via user device 210) during the execution of the configuration of the model. For example, user device 210 may provide the result for display, and the user may interact with the result (e.g., a graphical interface, etc.) and/or the model during execution of the configuration of the model (e.g., the user may pause the execution, may abort the execution, etc.). As another example, user device 210 may provide, for display, a numerical result associated with the execution of the configuration of the model, an example of which is described above with regard to reference numbers 665 and 670 in FIG. 6D. As another example, user device 210 may provide, for display, a graphical interface associated with profile information determined based on executing the configuration of the model. As another example, user device 210 may provide the result as an object in a workspace associated with TCE 220 (e.g., execution profile information may be provided in the form of an execution profile object).

In some implementations, user device 210 may determine, based on a base result and a test result received by user device 210, whether a test configuration of a model is functionally equivalent to a base configuration of a model, and may provide the result for display along with information associated with whether the test configuration of the model is functionally equivalent to a base configuration of the model, as described above.

Similarly, in some implementations, user device 210 may determine, based on test performance information, associated with the test model, and base performance information, associated with the base model, whether the test model is functionally equivalent to the base model, and may provide the test performance information and the base performance information for display along with information associated with whether the test model is functionally equivalent to the base model. In some implementations, user device 210 may also provide, for display, the test performance information and/or the base performance information, an example of which is described above with regard to reference numbers 665 and 670 in FIG. 6D.

Although FIGS. 7A and 7B shows example blocks of process 700, in some implementations, process 700 may include additional blocks, fewer blocks, different blocks, or differently arranged blocks than those depicted in FIGS. 7A and 7B. Additionally, or alternatively, two or more of the blocks of process 700 may be performed in parallel.

Implementations described herein may allow a user device to determine whether a test configuration of a model is functionally equivalent to a base configuration of the model, and identify one or more configuration parameters of the model that, if altered between the base configuration and the test configuration, may or may not result in functional inequivalence between the base configuration of the model and the test configuration of the model. Implementations described herein may also allow the user device to determine performance information, associated with executing the base configuration of the model and the test configuration of the model, by causing each configuration of the model to be executed on a corresponding type of target processor.

The foregoing disclosure provides illustration and description, but is not intended to be exhaustive or to limit the implementations to the precise form disclosed. Modifications and variations are possible in light of the above disclosure or may be acquired from practice of the implementations. For example, while the processes and/or methods described herein are described in the context of determining performance information, associated with a configuration of model, by causing program code, associated with the configuration of the model, to be executed on one or more different types of target processors, these processes and/or methods may equally apply in other contexts, such as causing the program code to be executed within different operating systems (e.g., on a particular type of processor), on different groups of processors (e.g., a particular type of CPU in combination with a particular type of GPU, a first type of CPU and a second type of CPU), or the like.

As used herein, the term component is intended to be broadly construed as hardware, firmware, and/or a combination of hardware and software.

The term program code is to be broadly interpreted to include text-based code that may be automatically executed (e.g., C code, C++ code, Hardware Description Language (HDL) code, very-high-speed integrated circuits (VHSIC) HDL(VHDL) code, Verilog, Java, and/or other types of hardware or software based code that may be compiled and/or synthesized); binary code that may be executed (e.g., executable files that may directly be executed by an operating system, bitstream files that can be used to configure a field programmable gate array (FPGA), Java byte code, object files combined together with linker directives, source code, makefiles, etc.); text files that may be executed in conjunction with other executables. In one example, program code may include different combinations of the above-identified classes (e.g., text-based code, binary code, text files, etc.). Alternatively, or additionally, program code may be of any type, such as function, script, object, etc., and a portion of program code may include one or more characters, lines, etc. of the program code.

Some implementations are described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, etc.

Certain user interfaces have been described herein and/or shown in the figures. A user interface may include a graphical user interface, a non-graphical user interface, a text-based user interface, etc. A user interface may provide information for display. In some implementations, a user may interact with the information, such as by providing input via an input component of a device that provides the user interface for display. In some implementations, a user interface may be configurable by a device and/or a user (e.g., a user may change the size of the user interface, information provided via the user interface, a position of information provided via the user interface, etc.). Additionally, or alternatively, a user interface may be pre-configured to a standard configuration, a specific configuration based on a type of device on which the user interface is displayed, and/or a set of configurations based on capabilities and/or specifications associated with a device on which the user interface is displayed.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware can be designed to implement the systems and/or methods based on the description herein.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items, and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A method, comprising:
   determining a functional inequivalence between a first configuration of a graphical model and a second configuration of the graphical model based on a first result of executing the graphical model in the first configuration, a second result of executing the graphical model in the second configuration, and an equivalency criterion,
      the graphical model including a set of connected blocks,
      the second configuration of the graphical model including a plurality of configuration parameters that are different than configuration parameters included in the first configuration of the graphical model,
      the plurality of configuration parameters describing a manner in which the graphical model or program code associated with the graphical model at least one of runs, operates, executes, or is generated,
      the plurality of configuration parameters including at least one of graphical model level configuration parameters or block level configuration parameters, and
      the determining the functional inequivalence being performed by one or more devices;
   identifying a first subset of configuration parameters that causes the functional inequivalence,
      the first subset of configuration parameters being at least one of the plurality of configuration parameters and being less than all of the plurality of configuration parameters,
      the identifying the first subset of configuration parameters including: performing a linear search or another search which divides the plurality of configuration parameters into two or more subsets, to identify the first subset of configuration parameters that causes the functional inequivalence including:
         causing at least one parameter of the plurality of configuration parameters in the second configuration and a corresponding at least one parameter in the first configuration to match and to produce a third configuration of the graphical model,
         determining whether the third configuration is functionally equivalent to the first configuration based on executing the graphical model in the third configuration, and
         selectively including the matched at least one parameter in the first subset of configuration parameters based on whether the third configuration is determined to be functionally equivalent to the first configuration, and
      repeating the linear search or the other search at least once with another at least one parameter of the configuration parameters in the second configuration, and
      the identifying the first subset of configuration parameters being performed by the one or more devices; and
   automatically modifying one or more of the first subset of configuration parameters to cause the graphical model in the second configuration to improve toward functional equivalence with the graphical model in the first configuration when the graphical model in the second configuration, with the modified one or more of the first subset of configuration parameters, is executed,
      the automatically modifying being performed by the one or more devices.

2. The method of claim 1, further comprising: causing first program code, associated with the graphical model in the first configuration, to be generated;
   causing the first program code to be executed; and
   determining the first result based on causing the first program code to be executed.

3. The method of claim 1, further comprising:
   identifying a type of target processor on which first program code, associated with the graphical model in the first configuration, is to be executed;
   causing the first program code to be executed on a target processor of the type of target processor; and
   determining the first result based on causing the first program code to be executed on the target processor.

4. The method of claim 3, further comprising:
   determining performance information, associated with the execution of the first program code on the target processor; and
   providing, for display, the performance information.

5. The method of claim 1, further comprising: causing the graphical model in the second configuration and the plurality of configuration parameters to be provided to a test device,
   the test device being a device associated with performing testing based on the plurality of configuration parameters,
   the testing including processor in the loop testing, field-programmable gate array in the loop testing, or hardware in the loop testing; and
   determining the second result as a result of the testing performed by the test device.

6. The method of claim 5, further comprising: determining information associated with the test device,
   the information associated with the test device including:
      information indicating that the test device includes a processor of a target type of processor,
      information indicating that the processor is available to perform the testing,
      version information associated with the processor, or
      quality of service information associated with the processor;
   and causing the graphical model in the second configuration and the plurality of configuration parameters to be provided to the test device based on the information associated with the test device.

7. The method of claim 1, further comprising:
   determining a coverage threshold associated with executing the graphical model in the second configuration;
   generating a test suite such that the coverage threshold is satisfied when the graphical model in the second configuration is executed;
   generating a test harness associated with the test suite; and
   executing the graphical model in the second configuration using the test suite and the test harness in order to determine the second result.

8. The method of claim 1, comprising:
   providing information indicating that the graphical model in the second configuration is not functionally equivalent to the graphical model in the first configuration, the information including information that identifies the first subset of configuration parameters.

9. A device, comprising:
one or more processors to:
determine a functional inequivalence between a first configuration of a graphical model and a second configuration of the graphical model based on a first result of executing the graphical model in the first configuration, a second result of executing the graphical model in the second configuration, and an equivalency criterion,
the graphical model including a set of connected blocks,
the second configuration of the graphical model including a plurality of configuration parameters that are different than configuration parameters included in the first configuration of the graphical model,
the plurality of configuration parameters describing a manner in which the graphical model or program code associated with the graphical model at least one of runs, operates, executes, or is generated, and
the plurality of configuration parameters including at least one of graphical model level configuration parameters or block level configuration parameters,
identify a first subset of configuration parameters that causes the functional inequivalence,
the first subset of configuration parameters being at least one of the plurality of configuration parameters and being less than all of the plurality of configuration parameters,
the one or more processors, when identifying the first subset of configuration parameters, are to:
perform a linear search or another search which divides the plurality of configuration parameters into two or more subsets, to identify the first subset of configuration parameters that causes the functional inequivalence and that causes the one or more processors to:
cause at least one of the plurality of configuration parameters in the second configuration and a corresponding at least one parameter in the first configuration to match and to produce a third configuration of the graphical model,
determine whether the third configuration is functionally equivalent to the first configuration based on executing the graphical model in the third configuration, and
selectively include the matched at least one parameter in the first subset of configuration parameters based on whether the third configuration is determined to be functionally equivalent to the first configuration, and
repeat the linear search or the other search at least once with another at least one parameter of the configuration parameters in the second configuration;
determine a modification to one or more of the first subset of configuration parameters that would cause the graphical model in the second configuration to improve toward functional equivalence with the graphical model in the first configuration when the graphical model in the second configuration is executed;
provide, for display, information associated with the functional inequivalence and the first configuration parameter,
the information indicating the modification; and
modify, based on a user input that selects the modification, the one or more of the first subset of configuration parameters based on the modification to cause the graphical model in the second configuration to improve toward functional equivalence with the graphical model in the first configuration when the graphical model in the second configuration, with the modified one or more of the first subset of configuration parameters, is executed.

10. The device of claim 9, where the first result includes a first numerical value, and the second result includes a second numerical value;
where the one or more processors, when determining the functional inequivalence, are to:
determine the equivalency criterion associated with determining whether the graphical model in the first configuration and the graphical model in the second configuration are functionally equivalent,
the equivalency criterion including a numerical threshold;
compare a difference between the first numerical value and the second numerical value to the numerical threshold; and
identify whether the graphical model in the first configuration and the graphical model in the second configuration are functionally equivalent based on comparing the difference to the numerical threshold.

11. The device of claim 9, where the one or more processors are further to:
determine the equivalency criterion associated with determining whether the graphical model in the first configuration and the graphical model in the second configuration are functionally equivalent,
the equivalency criterion including a program code difference threshold;
compare a difference between first program code, associated with the first configuration of the graphical model, and second program code, associated with the second configuration of the graphical model, to the program code difference threshold; and
determine the functional inequivalence based on comparing the difference to the program code difference threshold.

12. The device of claim 9, where the one or more processors are further to:
determine that the first configuration of the graphical model and the third configuration of the graphical model are functionally equivalent;
identify a particular configuration parameter, of the third configuration of the graphical model, that, if modified does not cause the first configuration of the graphical model and the third configuration of the graphical model not to be functionally equivalent; and
provide information that identifies the particular configuration parameter, the information that identifies the particular configuration parameter being provided to allow a user to modify the particular configuration parameter.

13. The device of claim 9, where the one or more processors are further to:

predict whether a setting of a particular configuration parameter, in the first configuration of the graphical model, if different than a setting of the particular configuration parameter, in the second configuration of the graphical model, will cause functional inequivalence between the first configuration of the graphical model and the second configuration of the graphical model,
a prediction being based on the first configuration of the graphical model and historical functional equivalence information; and
identify the second configuration of the graphical model based on the prediction.

14. A computer-readable medium storing instructions, the instructions comprising:
one or more instructions that, when executed by one or more processors, cause the one or more processors to:
determine a functional inequivalence between a base configuration of a graphical model and a test configuration of the graphical model based on a base result of executing the graphical model in the base configuration, a test result of executing the graphical model in the test configuration, and an equivalency criterion,
the graphical model including a set of connected blocks,
the equivalency criterion indicating that the graphical model in the test configuration is functionally equivalent to the graphical model in the base configuration when a difference between the test result and the base result satisfies a threshold,
the test configuration of the graphical model including a plurality of configuration parameters that are different than configuration parameters included in the base configuration of the graphical model,
the plurality of configuration parameters describing a manner in which the graphical model or program code associated with the graphical model at least one of runs, operates, executes, or is generated, and
the plurality of configuration parameters including at least one of graphical model level configuration parameters or block level configuration parameters;
identify a first subset of configuration parameters that causes the functional inequivalence,
the first subset of configuration parameters being at least one of the plurality of configuration parameters and being less than all of the plurality of configuration parameters,
the one or more instructions, that cause the one or more processors to identify the first subset of configuration parameters, cause the one or more processors to:
perform a linear search or another search which divides the plurality of configuration parameters into two or more subsets, to identify the first subset of configuration parameters that causes the functional inequivalence and that causes the one or more processors to:
cause at least one of the plurality of configuration parameters in the test configuration and a corresponding at least one parameter in the base configuration to match and to produce a modified configuration of the graphical model,
determine whether the modified configuration is functionally equivalent to the base configuration based on executing the graphical model in the modified configuration, and
selectively include the matched at least one parameter in the first subset of configuration parameters based on whether the modified configuration is determined to be functionally equivalent to the base configuration, and repeat the linear search or the other search at least once with another at least one parameter of the configuration parameters in the test configuration;
determine a modification to one or more of the first subset of configuration parameters that would cause the graphical model in the test configuration to improve toward functional equivalence with the graphical model in the base configuration when the graphical model in the test configuration is executed;
provide, for display, information associated with the functional inequivalence and the first subset of configuration parameters, the information indicating the modification; and
modify, based on a user input that selects the modification, the one or more of the first subset of configuration parameters based on the modification to cause the graphical model in the test configuration to improve toward functional equivalence with the graphical model in the base configuration when the graphical model in the test configuration, with the modified one or more of the first subset of configuration parameters, is executed.

15. The computer-readable medium of claim 14, where the one or more instructions, when executed by the one or more processors, further to cause the one or more processors to:
identify a first type of target processor and second type of target processor;
cause base program code, associated with the base configuration of the graphical model, to be generated;
cause the base program code to be executed on a target processor of the first type of target processor;
cause test program code, associated with the test configuration of the graphical model, to be generated; and
cause the test program code to be executed on a target processor of the second type of target processor.

16. The computer-readable medium of claim 15, where the one or more instructions, when executed by the one or more processors, further to cause the one or more processors to:
determine base performance information, associated with the base program code, based on causing the base program code to be executed on the target processor of the first type of target processor;
determine test performance information, associated with the test program code, based on causing the test program code to be executed on the target processor of the second type of target processor; and
provide, for display, the base performance information and the test performance information.

17. The computer-readable medium of claim 16, where the one or more instructions, that cause the one or more processors to provide, for display,
the base performance information and the test performance information, cause the one or more processors to:

provide the base performance information for display in near-real time during the execution of the base program code on the target processor of the first type of target processor; and provide the test performance information for display in near-real time during the execution of the test program code one the target processor of the second type of target processor.

18. The computer-readable medium of claim 14, where the one or more instructions, when executed by the one or more processors, further cause the one or more processors to:

receive user input associated with the equivalency criterion, the user input being associated with at least one of:
  a scripting language,
  a programming language, an evolving language,
  a requirements language,
  or the graphical model;
  and
determine the equivalency criterion based on the user input.

19. The computer-readable medium of claim 14, where the base result includes a first numerical value, the test result includes a second numerical value, and the equivalency criterion includes a numerical threshold;

where the one or more instructions, that cause the one or more processors to determine the functional inequivalence, further cause the one or more processors to:
  compare a difference between the first numerical value and the second numerical value to the numerical threshold; and
  determine the functional inequivalence based on comparing the difference to the numerical threshold.

20. The computer-readable medium of claim 14, where the one or more instructions, further cause the one or more processors to:

provide the graphical model in the test configuration for web-based performance testing;
receive a result of the web-based performance testing for the graphical model in the test configuration; and
determine the test result as a result of the web-based performance testing.

21. The method of claim 1, where the plurality of configuration parameters include configuration parameters associated with at least one of:
  a quantity of random access memory usage during an execution of the graphical model in the second configuration,
  a quantity of read only memory usage during the execution of the graphical model in the second configuration,
  enabling a conditional input branch execution parameter,
  enabling a use floating-point multiplication to handle net slope corrections parameter, numerical accuracy associated with the graphical model in the second configuration, or
  an operation of a compiler.

22. The method of claim 1, where the plurality of configuration parameters in the second configuration include the block level configuration parameters for the set of connected blocks.

23. The method of claim 1, where the identifying the first subset of configuration parameters includes:
  including the at least one of the plurality of configuration parameters in the first subset of configuration parameters, when the third configuration of the graphical model is determined to be functionally equivalent to the first configuration of the graphical model.

24. The device of claim 9, where the one or more processors are further to: determine a setting of a particular configuration parameter, in the first configuration of the graphical model, if different than a setting of the particular configuration parameter, in the second configuration of the graphical model, will cause functional inequivalence between the first configuration of the graphical model and the second configuration of the graphical model; and prevent a user from setting the particular configuration parameter, in the second configuration of the graphical model, from being different than the setting of the particular configuration parameter, in the first configuration of the graphical model, based on determining the setting will cause the functional inequivalence.

* * * * *